US008558234B2

(12) United States Patent
Nikzad et al.

(10) Patent No.: US 8,558,234 B2
(45) Date of Patent: Oct. 15, 2013

(54) LOW VOLTAGE LOW LIGHT IMAGER AND PHOTODETECTOR

(75) Inventors: Shouleh Nikzad, Valencia, CA (US); Chris Martin, Pasadena, CA (US); Michael E. Hoenk, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 41 days.

(21) Appl. No.: 13/026,119

(22) Filed: Feb. 11, 2011

(65) Prior Publication Data
US 2011/0256655 A1  Oct. 20, 2011

Related U.S. Application Data

(60) Provisional application No. 61/303,558, filed on Feb. 11, 2010.

(51) Int. Cl.
*H01L 31/00* (2006.01)

(52) U.S. Cl.
USPC ............. 257/59; 257/72; 257/80; 257/84; 257/222; 257/223; 257/225; 257/228; 257/229; 257/231; 257/233; 257/E29.11; 257/E29.191; 257/E29.251; 257/E21.254; 438/48; 438/57; 438/60; 438/66; 438/67; 438/73; 438/75; 438/76; 438/78; 438/91

(58) Field of Classification Search
USPC ........... 438/48, 57, 60, 66, 67, 73, 75, 76, 78, 438/91; 257/59, 72, 80, 84, 222, 223, 225, 257/228, 229, 231, 233, 451, 460, E29.11, 257/E29.191, E29.251, E21.254
See application file for complete search history.

(56) References Cited

U.S. PATENT DOCUMENTS

| 4,822,748 A * | 4/1989 | Janesick et al. ................. 438/75 |
| 5,793,230 A * | 8/1998 | Chu et al. ......................... 327/77 |
| 6,278,119 B1 | 8/2001 | Nikzad et al. |
| 6,403,963 B1 | 6/2002 | Nikzad et al. |
| 7,592,747 B1 | 9/2009 | Beach et al. |
| 2003/0178633 A1* | 9/2003 | Flynn et al. ..................... 257/101 |
| 2006/0138322 A1* | 6/2006 | Costello et al. ................. 250/305 |

OTHER PUBLICATIONS

Rocke et al. ("Acoustically Driven Storage of Light in a Quantum Well", Phys. Rev. Letters, 78, pp. 4099-4102, May 1997).*
Deelman et al. ("Delta-doped CCD's with Integrated UV Coatings", SPIE Proc., vol. 3965, pp. 462-466, May 2000).*
Wiki_Ref (see attached reference, Electric Field).*
Beach et al., "Piezoelectric fields in nitride devices", J. Vac. Sci. Technol., Jul./Aug 1999, vol. B17. No. 4, pp. 1753-1756.
Benjamin et al., "Observation of a negative electron affinity for heteroepitaxial AIN on a(6H-SIC(0001)", Appl. Phys. Lett., Jun. 13, 1994, vol. 64, No. 24, pp. 3288-3290.
Bermudez, "Study of oxygen chemisorption on the GaN(0001)-(1 X 1) surface", J. Appl. Phys., Jul. 15, 1996, vol. 80, No. 2, pp. 1190-1200.

(Continued)

*Primary Examiner* — Yasser Abdelaziez
(74) *Attorney, Agent, or Firm* — Kauth, Pomeroy, Peck & Bailey LLP

(57) ABSTRACT

Highly efficient, low energy, low light level imagers and photodetectors are provided. In particular, a novel class of Della-Doped Electron Bombarded Array (DDEBA) photodetectors that will reduce the size, mass, power, complexity, and cost of conventional imaging systems while improving performance by using a thinned imager that is capable of detecting low-energy electrons, has high gain, and is of low noise.

36 Claims, 22 Drawing Sheets

(56) References Cited

OTHER PUBLICATIONS

Blacksberg et al., "Enhanced quantum efficiency of high-purity silicon imaging detectors by ultralow temperature surface modification using Sb doping", Applied Physics Letters, 2005, vol. 87, pp. 254101-1-254101-3.
Bridger et al., "Measurement of induced surface charges, contact potentials, and surface states in GaN by electric force microscopy", Applied Physics Letters, Jun. 7, 1999, vol. 74, No. 23, pp. 3522-3524.
Bykhoski et al., "Piezoelectric doping and elastic strain relaxation in AIGaN-GaN heterostructure field effect transistors", Applied Physics Letters, Dec. 14, 1998, vol. 73, No. 24, pp. 3577-3579.
Clarke et al., "Ultraviolet Remote Sensing Techniques for Planetary Aeronomy", Atmospheres in the Solar System: Comparative Aeronomy Geophysical Monograph, 2002, pp. 339-351.
Eyckeler et al., "Negative electron affinity of cesiated p-GaN(0001) surfaces", J. Vac. Sci. Technol., Jul./Aug 1988, vol. B164, No. 4, pp. 2224-2228.
Hancock et al., "Multi-megarad (Si) radiation tolerant integrated CMOS imager", Proceedings of SPIE, 2001, vol. 4306, pp. 147-155.
Hoenk et al., "Delta-doped back-illuminated CMOS imaging arrays: Progress and prospects", Proc. of SPIE, 2009, vol. 7419, pp. 74190T-1-74190T-15.
Hoenk et al., "Epitaxial growth of p+ silicon on a backside-thinned CCD for enhanced UV response", SPIE, High-Resolution Sensors and Hybrid Systems, 1992, vol. 1656, pp. 488-496.
Hoenk et al., "Growth of a delta-doped silicon later by molecular beam epitaxy on a charge-coupled device for reflection-limited ultraviolet quantum efficiency", Appl. Phys. Lett., Aug. 31, 11992, vol. 61, No. 9, pp. 1084-1086.
Janesick et al., "Recent Developments in Large Area Scientific CCD Image Sensors", SPIE, 1989, vol. 1071, pp. 115-123.
Jenkins et al., "High Precision Photometry with Back-Illuminated CCDs", ASP Conference Series, 1997, vol. 119, pp. 277-280.
Jerram et al., "The LLLCCD: Low Light Imaging without the need for an intensifier", Proceedings of SPIE, 2001, vol. 4306, pp. 178-186.
Jiang et al., "Extremely narrow Sb Delta-Doped Epitaxial Characterized by X-Ray Reflectivity", Chin. Phys. Lett., 1997, vol. 14, No. 9, pp. 686-689.
Jones et al., "Tinned Charged Coupled Devices with Flat Focal Planes for UV Imaging", Proceedings of SPIE, 2000, vol. 3965, pp. 148-156.
Joseph, "UV detective quantum efficiency measurements", SPIE, Jul. 1999, vol. 3764, pp. 246-253.
Khan et al., "Observation of a two-dimensional electron gas in low pressure metalorganic chemical vapor deposited GaN-AlxGa1-x heterojunctions", Appl. Phys. Lett., Jun. 15, 1992, vol. 60, No. 24, pp. 3027-3029.

Kovacs et al., "Bulk Micromachining of Silicon", Proceedings of the IEEE, Aug. 1998, vol. 86, No. 8, pp. 1536-1551.
Kung et al., "A compact, inexpensive apparatus for one-sided etching in KOH and HF", Sensors and Actuators A, 1991, vol. 29, pp. 209-215.
Lowrance et al., "Permanent magnet focused XUV image sensor", Photoelectronic Image Devices, 1991, Institute of Physics Conference Series No. 121, pp. 75-84.
Machuca et al., "Prospect for high brightness III-nitride electron emitter", J. Vac. Sci. Technol., Nov./Dec. 2000, vol. B18, No. 6, pp. 3042-3046.
Nikzad et al., "Delta-doped CCDs as stable, high sensitivity, high resolution UV imaging arrays", Proc. of SPIE, 1994, vol. 2217, pp. 355-364.
Nikzad et al., "Delta-doped CCDs: High QE with long-term stability at UV and visible wavelengths", Proc. of SPIE, 1994, vol. 2198, pp. 907-915.
Nikzad et al., "Direct detection and imaging of low-energy electrons with delta-coped charge-coupled devices", Applied Physics Letter, Dec. 7, 1998, vol. 73, No. 23, pp. 3417-3419.
Nikzad et al., "Direct detection of 0.1-20 keV electrons with delta doped, fully depleted, high purity silicon $p$-$i$-$n$ diode arrays", Applied Physics Letter, 2006, vol. 89, pp. 182114-1-182114-3.
Nikzad et al., "Low-energy electron detection with delta-doped CCDs", Proc. of SPIE, 1997, vol. 3019, pp. 241-248.
Nikzad et al., "Recent Results with Delta-doped CCDs", Proceedings of the 1997 IEEE Workshop on CCDs & Advanced Imaging Sensors, 1997, 4 pgs.
Parry et al., "Temperature dependence of incorporation processes during heavy boron doping in silicon molecular beam epitaxy", J. Appl. Phys., Jan. 1, 1992, vol. 71, No. 1, pp. 118-125.
Rich et al., "Adsorption and interaction of Sb on Si(001) studied by scanning tunneling microscopy and core-level photoemission", Physical Review B, Jun. 16, 1989, vol. 39, No. 17, pp. 12758-12763.
Savoye et al., "High sensitivity Charge-Coupled Device (CCD) imagers for television", Proc. of SPIE, 1984, vol. 50, pp. 32-39.
Schmitz et al., "Metal Contacts to n-Type GaN", Journal of Electronic Materials, 1998, vol. 27, No. 4, 99. 225-260.
Smith et al., "Modification of the Surface Band-Bending of a Silicon CCD for Low-energy Electron Detection", Mat. Res. Soc. Symp. Proc, 1997, vol. 448, pp. 177-186.
Sze, "Physics and Properties of Semiconductors—A Resume", Physics of Semiconductor Devices, 1981, pp. 7-60.
Winzenread, "Flat, Thinned Scientific CCDs", Proc. of SPIE, 1994, vol. 2198, pp. 886-894.
Woody et al., "Recent performance data on the Tektronix TK1024A imager: Back illuminated, MPP and non-MPP operating modes", Proc. of SPIE, 1992, vol. 1656, pp. 617-626.
Wu et al., "Electronic states at aluminum nitride (0001)-1X1 surfaces", Applied Physics Letter, Jan. 25, 1999, vol. 74, No. 4, pp. 546-548.

* cited by examiner

LOW VOLTAGE LOW LIGHT IMAGER AND PHOTODETECTOR

STATEMENT OF RELATED APPLICATIONS

The current application claims priority to U.S. Provisional. Application No. 61/303,558, filed Feb. 11, 2010, the disclosure of which is incorporated herein by reference.

STATEMENT AS TO FEDERALLY SPONSORED RESEARCH

The invention described herein was made in the performance of work under a NASA contract, and is subject to the provisions of Public Law 96-517 (35 USC 202) in which the Contractor has elected to retain title.

FIELD OF THE INVENTION

The current invention is directed to imagers and photodetectors; and more particularly to low voltage, low light imagers and photodetectors for use as night vision goggles, electron bombarded Charge-Coupled Device (CCD) or Complementary Metal-Oxide-Semiconductor (CMOS) imagers and image tubes.

BACKGROUND OF THE INVENTION

Current detection technology can be classified into two major categories: (1) solid-state devices based on silicon or wide bandgap semiconductors, and (2) a combination of photoemissive device (e.g., photocathode), a gain component (e.g., a microchannel plate), and an electron detector. FIG. 1 summarizes the quantum efficiency of some conventional. UV detectors.

In the first category, an immense investment has been made in silicon visible imagers in order to produce detectors with very low noise, low dark current, and very large formats (e.g., larger than 4 k·4 k pixels). In addition, new techniques such as lateral gain CCDs and low noise CMOS sensors are being developed so that silicon sensors continue to improve and become viable for photon counting applications. It is of course possible to use silicon sensors directly as a UV detector. The problem is that silicon sensors are almost never solar blind, a feature that is required for use in most interplanetary applications. In fact, the UV sensitivity must be incorporated as an "add-on" since conventional devices usually begin to cut off for wavelengths shorter than about 400 nm. The UV response is therefore almost always worse than the visible. While it is possible to make a camera system solar blind by using optical. filtering, the UV/visible rejection ratio desired by most planetary applications places enormous burdens on the filler designer. The less than unity UV/visible response-ratio of silicon sensors makes a challenging job even more difficult.

New materials such as gallium nitride (GaN), silicon carbide, and even diamond are being formed into detector arrays. Usually an array of diodes is made and is hybridized to a CMOS readout. Additionally, monolithic imagers with transistors made from the host or substrate material. exist at least in concept. These materials offer the promise of direct solar-blind UV imagers and research into their development is important. However, realistically, it will be more than a decade before monolithic imagers (not photocathodes) in these new materials can provide performance equivalent to silicon imagers.

The available detector chosen for most imaging applications has been a microchannel plate (MCP)-based imager. MCP-based detectors use a solar-blind photocathode that absorbs photons (UV, visible or near-IR) and ejects the photoelectrons into the vacuum. The free electrons are then collected by an MCP that is made from an array of tubes that are on the order of ten micrometers in diameter. Electrons entering these tubes are accelerated by high fields and they free electrons from the tube walls in each collision, creating an electron multiplier effect. The MCP provides electron signal. gain while the tube structure confines the electrons and preserves the spatial. information. Electron bursts generated by the MCP are read out by various schemes such as multi-anode arrays. Another scheme for readout consists of a phosphor for conversion of electrons to photons and a silicon imager (CCD or CMOS) sometimes coupled through fiber optic faceplates. The latter readout scheme is often referred to as an image intensifier.

While MCP-based imagers have been used successfully, they have significant drawbacks, such as low QE, limited resolution, small format size, limited number of pixels, high voltage requirements, and difficulty of fabrication in sealed-tube configuration. The QE in practice is ~10% for wavelengths longer than 150 nm. Attempts to incorporate opaque near UV photocathodes on MCPs have faded. Resolution appears to be limited to 25-40 microns by fundamental. charge cloud variance in MCPs that cannot be predicted a priori. Also, format size cannot exceed 60 mm without great cost and difficulty, especially in sealed tubes. There are also practical. difficulties that can make their inclusion in low-cost, short-duration flight development programs problematic (in particular, the acquisition of quality MCPs, especially in the larger formats, and the yield of sealed tube fabrication cycles). High voltage stability and arcing is a chronic concern, especially with proximity-focused photocathodes. While large-format sealed tube MCP detectors have been made (e.g., 65 mm diameter for GALEX), their fabrication is extraordinarily challenging and not readily duplicated.

Electron Bombarded CCDs (EBCCDs) were developed to overcome the limitations of MCPs. They eliminate the MCP and instead accelerate the photoelectrons from the photocathode directly into the back surface of a CCD. In a typical. EBCCD, photoelectrons are accelerated by ~10-20 keV and a permanent magnet is used to bend the electrons away from the light path and into the back-illuminated CCD anode (see FIG. 2). Energetic photoelectrons penetrate the surface electrode of the back-illuminated CCD and enter the low-doped sensitive region, where each incident photoelectron liberates many signal. electrons. Since the input-referred noise floor of a moderate-speed CCD is on the order of 5 to 25 electrons, modest multiplication is required in order to allow the EBCCD to be single-photon counting at near UV wavelengths. Moreover, because silicon detectors are sensitive to background radiation at visible and near infrared wavelengths, a magnetic or electrostatic field is used to bend the photoelectrons around a light shield so that there is no direct line-of-sight between the photocathode and CCD. (See, Lowrance, et. al., *Photoelectronic Image Devices,* 1991, ed. B. L. Morgan, Institute of Physics Conference Series No. 121, the disclosure of which is incorporated herein by reference.) Stray visible light reflected off the photocathode is absorbed by the light shield.

EBCCDs have the highest QE of the currently available detectors/imagers (40% vs. 20% for MCP-based detectors and 5% for CCD/Woods filler combination—all at 120 nm). (See, C. Joseph, *Proc. SPIE* 3764, 246 (1999), the disclosure of which is incorporated herein by reference.) EBCCDs also benefit from the mature and high quality silicon imaging technology, they are solar blind, they can photon count, and they are, in concept, simpler than MCP-based detectors. However, because conventional. EBCCD technology would merely replace the bulky, expensive, fragile, high voltage MCP-phosphor system with a system that is also bulky, expensive, fragile, and requires very high voltage, conventional. EBCCD systems have not realized their full promise and have found rather limited application. In short, while EBCCDs arrays are potentially very effective solar blind photon counting detectors, their use has been limited due to two major issues:

> They are bulky due to the high voltage requirements and large permanent magnets; and
> They are hard to manufacture due to their highly reactive and therefore unstable photocathodes.

The first issue (i.e., need for high voltage) stems from the fact that existing EBCCDs cannot detect low-energy electrons because such electrons cannot penetrate their thick back surface electrode. In order to circumvent this limitation, conventional. EBCCDs accelerate photogenerated electrons to more than 10-15 keV. At these energies, electrons impinging on existing EBCCDs carry sufficient energy to create damaging x rays. The second issue, involving the chemical. reactivity and instability of UV photocathodes, has to be addressed by the use of better photocathode.

Accordingly, a need exists to develop a highly efficient, compact, low mass imager capable of operating as an Electron Bombarded Array (EBA, either CCD or CMOS), Night Vision system, or Image Tube.

SUMMARY OF THE INVENTION

The current invention is directed to a highly efficient, compact, low mass imaging photodetector capable of operating as an Electron Bombarded Array (EBA, either CCD or CMOS), Night Vision system, or Image Tube, the inventive photodetector shall be referred to hereinafter as a Della-Doped Electron Bombarded Array (DDEBA), which can include Della-Doped Electron Bombarded Charge-Coupled Devices (DDEBCCD) and Della-Doped Electron Bombarded Complementary Metal-Oxide-Semiconductor (DDEBCMOS) or Della-Doped Electron Bombarded Active Pixel. Sensor (DDEBAPS). For the purposes of this invention DDEBCMOS and DDEBAPS are equivalent and are used interchangeably.

In one embodiment, the photodetector includes a photocathode and an imaging array disposed across an accelerating gap from each other.

In one such embodiment, the photodetector is formed of a non-cesiated semiconductor material. having an activation layer that enables at least one photon within a wavelength range that impinges on said photocathode to cause emission of at least one electron from the surface of said photocathode. In such an embodiment, the photocathode has an active layer that is one of either a piezoelectrically induced polarization field or delta-doped layer. In one such embodiment, the non-cesiated semiconductor material is a III-N semiconductor material.

In another such embodiment, the imager array is a thinned delta-doped imager array. In such an embodiment, the imager array creates a signal. by producing a plurality of electrons from each of the accelerated electrons that impinges thereon, while generating only a single electron for photons that impinge directly thereon. In such an embodiment, the imager array is one of either a DDEBCMOS or DDEBCCD detector.

In still another such embodiment, the accelerating gap is sufficiently small such that the electrons produced from said photocathode are proximity focused onto said imager array. In such an embodiment, the electric field generator for generating the electric field across the accelerating gap is designed to accelerate photogenerated electrons across said accelerating gap to impinge on said imager array.

In yet another embodiment, the photodetector further includes detector circuitry in signal. communication with said imager array for monitoring the signal. and applying a threshold detection level. to the signal.

In still yet another embodiment, the distance of the accelerating gap between the photocathode and the imager array is less than 1000 microns.

In still yet another embodiment, the potential. of the electric field is less than 1 kV.

In still yet another embodiment, the imager array includes a thin layer of a single-crystal. semiconductor deposited on the backside thereof. In one such embodiment the thin layer incorporates a sheet of doping material. In such an embodiment, the doping material can be a single monolayer of about $2\times10^{14}$ boron atoms/cm$^2$ disposed about 0.5 nm from the backside surface of the imager.

In still yet another embodiment, the imaging array is a delta-doped CMOS imaging array. In one such embodiment the detector includes signal. processing electronics in signal. communication with the imager array for providing random access readout of said imager array. In such an embodiment, the power required to operate the detector is less than about 1 watt. In still another such embodiment, the detector may also include signal. processing electronics in signal. communication for integrating the signal. from the imager array with a signal. spectrum from another spectrometer.

In still yet another embodiment, the specified wavelength falls within one of the spectral. ranges selected from infrared, visible or ultraviolet.

In still yet another embodiment, the imager array is capable of detecting electrons having energies of at least as low as 100 eV.

In still yet another embodiment, the semiconductor material is a III-N material. In such an embodiment the semiconductor material. may be one of either a GaN or AlGaN film disposed on a sapphire or GaN substrate.

In still yet another embodiment, the imager array exhibits no degradation in efficiency at a radiation exposure of up to 10 krad.

In still yet another embodiment, the detector is configured for use in one of the following applications: atmospheric analysis, aurorae study, mineralogical analysis and low-light vision.

In still yet another embodiment, the invention is directed to a method of forming a photodetector. In one such embodiment, the method includes the following steps:

> providing at least one spacer having first and second ends;
> disposing at one end of said spacer a photocathode formed of a non-cesiated semiconductor material., said photocathode having an activation layer that has one of either a piezoelectrically induced polarization field or is delta-doped, wherein the activation layer that enables at least one photon within a wavelength range that impinges on said photocathode to cause emission of at least one electron from the surface of said photocathode;
> disposing at the other end of said spacer a thinned delta-doped imager array, wherein the imager array creates a signal. by producing a plurality of electrons from each of the accelerated electrons that impinges thereon, while generating only a single electron for photons that impinge directly thereon;

wherein the space between said photocathode and said imager array defines an accelerating gap, wherein the accelerating gap is sufficiently small such that the electrons from said photocathode are proximity focused onto said imager array; and disposing an electric field generator into electrical communication with said accelerating gap, such that said electric field generator generates an electric field across said accelerating gap, said electric field being designed to accelerate said at least one electron across said accelerating gap to impinge on said imager array.

In one such embodiment, the non-cesiated semiconductor material is a III-N semiconductor material.

BRIEF DESCRIPTION OF THE DRAWINGS

These and other features and advantages of the present invention will be better understood by reference to the following detailed description when considered in conjunction with the accompanying data, wherein.

DETAILED DESCRIPTION OF THE INVENTION

The current invention is directed to highly efficient, low energy, low light level imagers and photodetectors. In particular, the current invention introduces Delta-doped Electron Bombarded Arrays (DDEBAs), a novel. class of photodetectors that will reduce the size, mass, power, complexity, and cost of conventional imaging systems while improving performance by using a thinned imager that is capable of detecting low-energy electrons, has gain and is of low noise.

In general. terms, a low light level photodetector can be a monolithic semiconductor structure (such as a semiconductor avalanche detector with integrated absorption and gain regions), or a composite photodetector comprised of discrete parts that perform the following functions: a photocathode that converts light to electrons, a gain mechanism to amplify the signal., and an electron sensor. A conventional. implementation of the composite photodetector uses a photocathode (either as a standalone component or deposited on a microchannel plate that, together with a high voltage source, converts light to electrons and provides electron multiplication to achieve the necessary conversion and gain functions).

When a microchannel plate is used, the photodetector is referred to an MCP detector (or an MCP-based detector). In the case of the MCP detector, amplification (or gain) is obtained by providing the interior surfaces of the glass tubes constituting the MCP with a high electron yield surface. Each incoming electron ricochets on a tube interior surface many times, producing as many as 300 additional. electrons for each incoming electron. Whereas it is desirable to eliminate the micro-channel. plate from the composite photodetector, such elimination requires an alternate method of providing gain. Electron-bombarded CCDs are conventional detectors that have eliminated the microchannel plate (MCP). In a conventional. EBCCD, the necessary gain is provided by accelerating electrons from the photocathode with high voltage and taking advantage of the conversion gain due to quantum yield in the semiconductor material.

Figure 1:
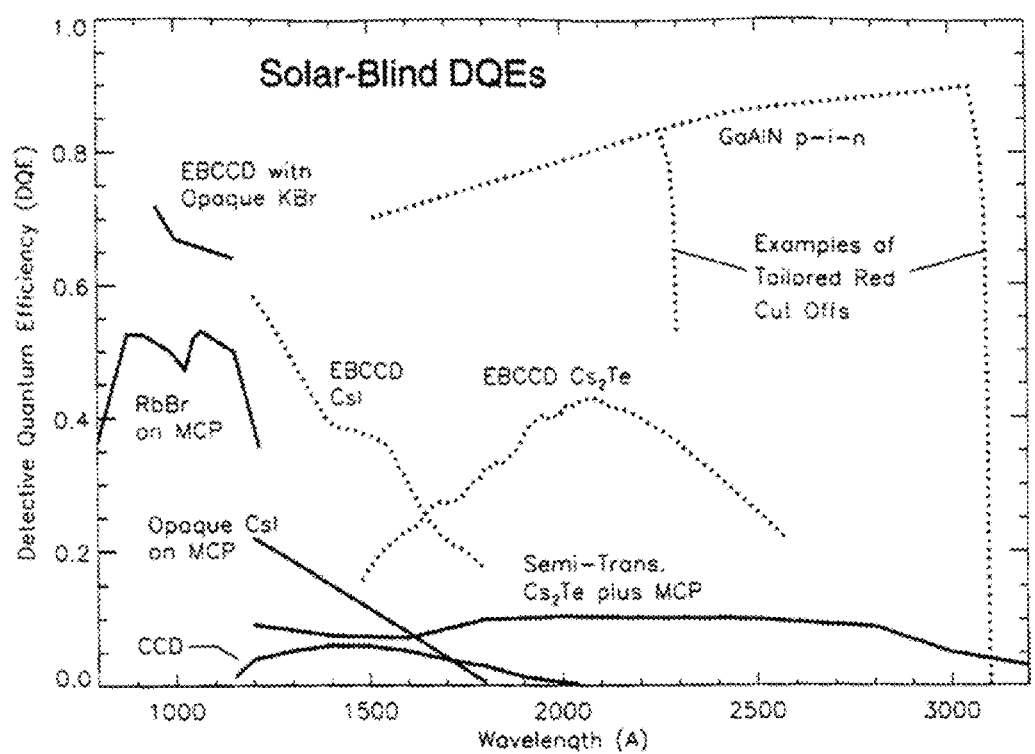
FIG. 1 provides a data graph of the quantum efficiency of existing solar-blind UV detectors.
Figure 2:
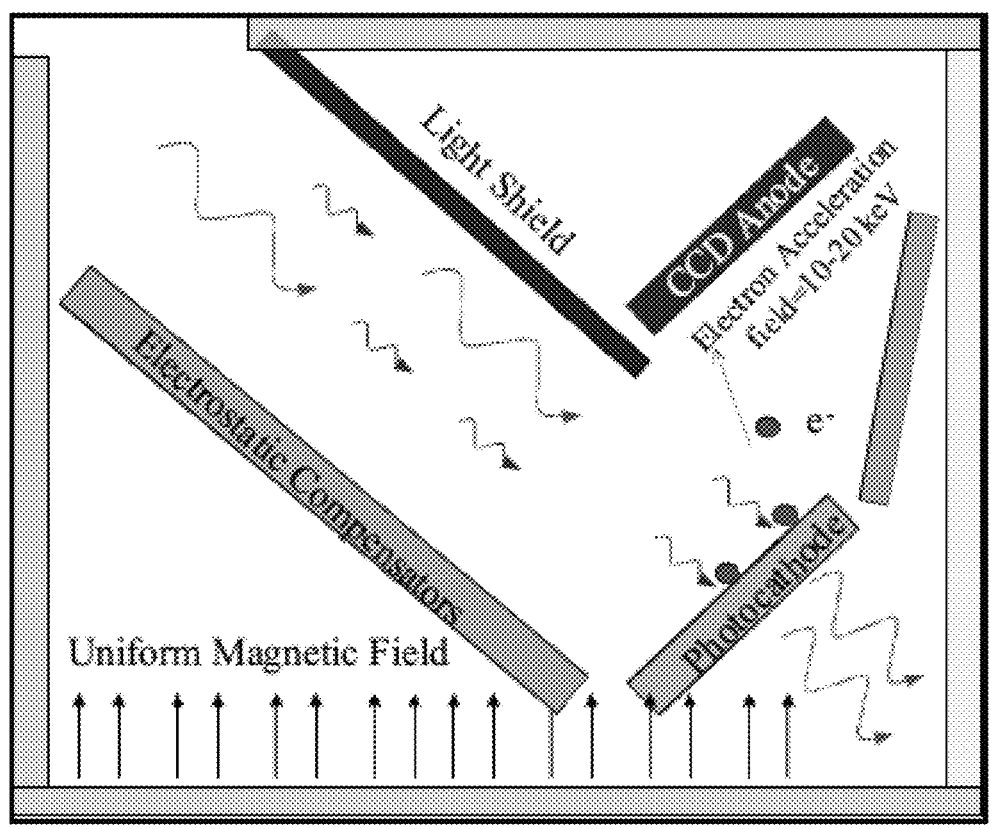
FIG. 2 provides a schematic of a conventional. EBCCD design with an opaque photocathode.

As shown in FIG. 2, the electron sensor in such a composite photodetector can be an electron-bombarded charge coupled device (EBCCD) or an electron-bombarded CMOS active pixel. sensor (EBAPS) imaging detector. The photocathode and the electron sensor generally are mutually facing planar devices separated by a vacuum gap across which a large (e.g., 10 kV) electric field is imposed. As photons from a field of view strike the photocathode, electrons are emitted from the surface of the photocathode facing the electron sensor. The emitted electrons are accelerated across the vacuum gap and strike the electron sensor. The electron sensor amplifies the electron current, providing the necessary gain by exploiting the quantum yield of the semiconductor material. of the EBCCD or EBAPS detector array.

Conventional. EBCCD or EBAPS are insensitive to low energy electrons, and therefore require high voltages to provide electrons with sufficiently high energy. Because of the high voltages required, this conventional. EBCCD or EBAPS detector array requires a large separation (gap) between photocathode and electron detector, and the large gap necessitates a magnetic field to maintain spatial. resolution, as shown in FIG. 2. To overcome this limitation, it is necessary to reduce the high voltage and also narrow the gap between photocathode and the imaging array to the point that proximity focusing is possible. This requirement dictates the use of a detector capable of high efficiency detection of low energy electrons with gain. There are four features required to making a compact, easy to fabricate, low cost, high efficiency photon counting imagers, namely, 1) Eliminate the requirement for high voltage;
2) Eliminate the need for microchannel plates;
3) Eliminate the instability inherent in conventional. photocathodes; and
4) Remove the need to use a magnet.

Figure 3:
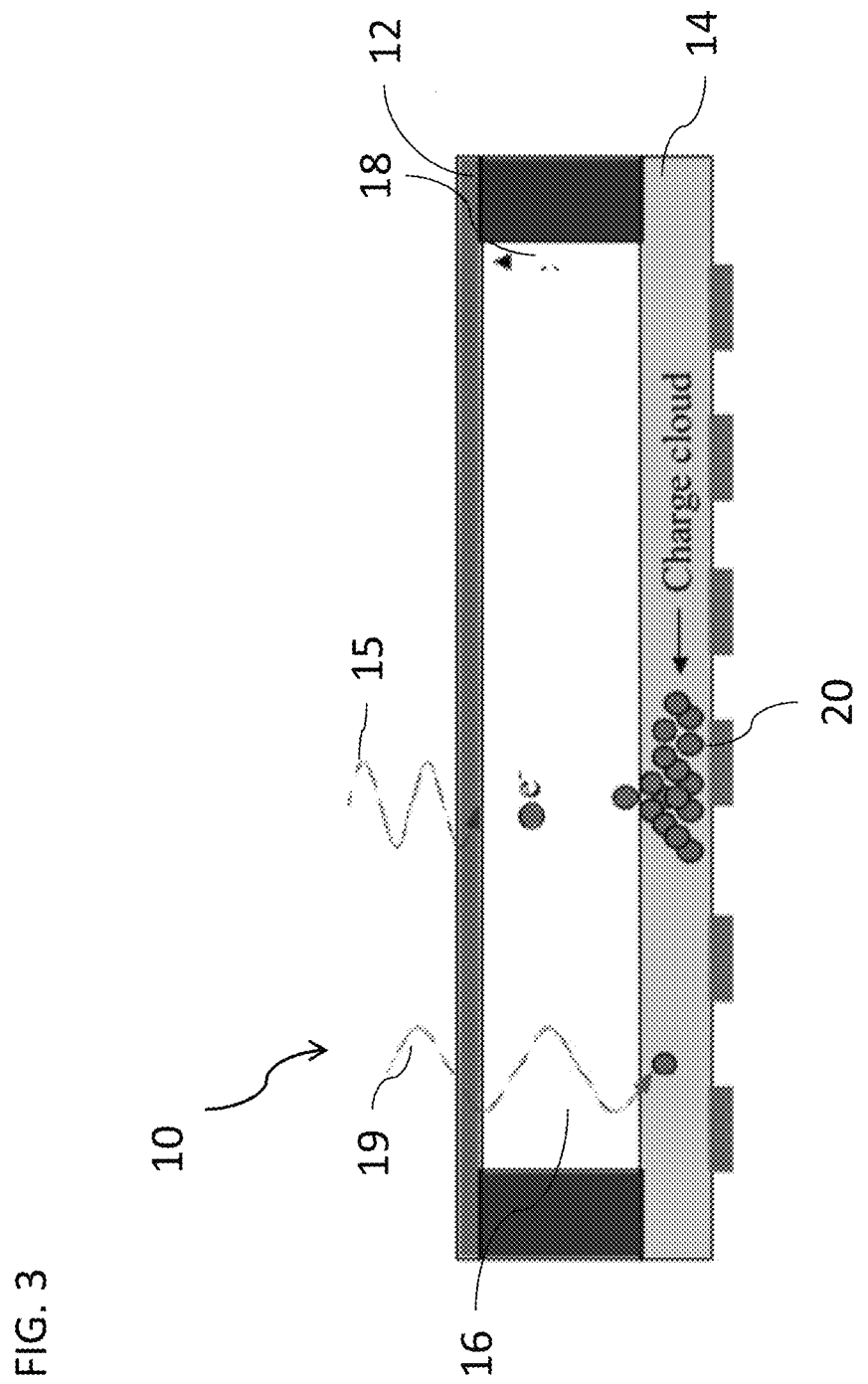
FIG. 3 provides a schematic of an exemplary embodiment of a detector in accordance with the current invention.

The inventive DDEBA detector technology takes advantage of the superior QE and resolution of conventional. EBCCDs and EBAPS (as compared to MCP-based photodetectors), while advancing the technology to overcome the aforementioned shortcomings. An exemplary embodiment of a DDEBA detector in accordance with the current invention is shown schematically in FIG. 3. The DDEBA device (10) in accordance with the invention generally comprises a photocathode (12) to absorb the desired light and produce electrons, a CCD or CMOS imager array (14) that is thinned and delta doped to detect low-energy electrons (15) produced in the photocathode disposed across an accelerating field space (16) from the photocathode, and an electric field generator capable of generating a low electric field (<kV) (18) across the accelerating field space between the photocathode and the imager array.

During operation of the DDEBA detector of the invention, light at a desired wavelength is absorbed by the photocathode (12) and electrons are produced. The electrons produced by the photocathode are then accelerated across the accelerating field space (16) by the electric field (18), to the delta-doped imager array (14). Light outside the desired wavelengths (19) will either be blocked or will be directly transmitted through the photocathode (12) will be detected by the DDEBCCD/DDEBAPS array (16). The directly transmitted photons will produce single electron-hole pairs in the DDEBA, while photoelectrons produced by the photocathode are accelerated by the electric field to 1 keV, and will produce over 200 pairs (20). In high data rate operation then, the directly transmitted photons represent noise, similar to but somewhat distinct from array read and dark noises. Applying a threshold to discriminate against background photons then allows the DDEBA to count the desired photons, thereby allowing flexible operation of the detector with no magnets. In addition, by keeping the distance between the photocathode and imager array small it is possible to proximity focus said photodetector thereby further improving performance.

As will be discussed in greater detail. below, the key innovations to this device are the thinned, delta-doped imaging array that possesses internal gain combined with a high efficiency, semitransparent photocathode in a novel., compact, proximity-focused EB image intensified configuration. In particular, the current invention is directed to an advanced Della-Doped Electron Beam Array (DDEBA) using high-gain delta-doped arrays (CCD or CMOS) and high efficiency, stable, photocathodes with the following features:

First, the detector uses delta-doping technology to modify the band-structure of the thinned CCD or CMOS Active Pixel. Sensor (APS) arrays used in the device and incorporating them in the EB format with a photocathode to provide the necessary low-energy electron detection capability. The result is an order of magnitude reduction in the low-energy electron detection threshold, and a simultaneous reduction in the required operating voltage and power of EB arrays.

Second, the detector of the invention reduces the complexity and increases the stability and efficiency of the detector by using a photocathode of an epitaxially-grown wide bandgap material. such as GaN and related alloys III-N alloys, and in particular GaN and AlGaN films with delta layers on sapphire or GaN substrates. III-N alloys have an intrinsic visible rejection without the use of costly, fragile, and bulky filters. In addition, they can be operated at high temperatures and in harsh environments. They are also radiation tolerant. III-N materials make excellent photocathodes and can be coupled in an EB configuration with the mature and high performance technology of silicon imagers. (See, e.g., R. Strittmatter, et al., "Investigation of Della-Doped III-Nitride Photocathodes for Stable Electron Emitting Surfaces", Materials Research Society, III-N Workshop, Pittsburg, Pa., July 2004, the disclosure of which is incorporated herein by reference.) However, although the specific advantages of III-N materials are described herein, it should be understood that other wide bandgap materials may be used depending on the spectral. range that the detector/imager in accordance with the invention is meant to cover.

Third, using the gain and low noise to threshold against the visible or out of band photo-electrons and therefore eliminate the requirement for the magnets.

Accordingly, using the inventive DDEBA design, it is possible to produce a detector that is compact (no high voltage power supplies or bulky magnets), low power (CCD/CMOS technology), highly stable and robust (novel. III-nitride photocathode and delta doped arrays). In addition, with a tunable photocathode, of the type proposed for use with the invention, it is possible to use the device to detect any spectrum of light from near-IR to UV.

The Photocathode

As described above, the current invention uses a class of highly efficient photocathodes that do not require deposition an activating metal. such as Cesium, and are impervious to exposure to atmosphere and may therefore be manufactured in a relatively efficient and inexpensive manner.

Background

The performance of any photocathode is limited by the efficiency with which the photocathode emits electrons in response to incoming photons. The photocathode is generally a planar semiconductor crystal. Each incident photon creates a hole-electron pair in the semiconductor crystal. by elevating an electron from the valence band to the conduction band, leaving a hole in the valence band. Generally, a semiconductor material having a bandgap energy corresponding to the infrared region (such as GaAs) does not readily emit electrons from its surface when struck by photons, due to an energy barrier that arises at the crystal. surface of the semiconductor. In order for surface emission to occur, the electron must overcome both the work function of the surface and the band gap energy of the semiconductor. Conventionally, this problem is overcome by "activating" the surface of the photocathode in such a manner that this energy barrier is overcome.

Standard "activated" photocathode materials in the case of UV or IR photocathodes are group III semiconductor or group III-V compound semiconductors, with an "activation" that consists of depositing a thin Cesium (Cs) coating on the crystal. surface. In such a material., the Fermi levels in the Cs and semiconductor layers equilibrate at the interface between the layers, forcing the valence and conduction band structures in the semiconductor layer to "bend" so much that the conduction band at the surface is below the Fermi level and the bulk conduction band bottom lies above the vacuum level at the surface. This condition is favorable for electron emission from the photocathode surface because electrons excited in the bulk can diffuse toward the surface where they can tunnel. or be ballistically emitted from the crystal. into the vacuum.

The problem with these materials is that the Cs coating step can only be performed in a vacuum, because Cs is highly reactive with oxygen and therefore unstable in oxygen containing environments. The surface activation of the photocathode is therefore extremely difficult and expensive to perform, and the "cesiated" device is neither robust nor permanent. It is unstable and not long lasting, being subject to attack when exposed even slightly to oxygen atoms or molecules. On the other hand, Cesium coating of the GaAs surface provides highly desirable photocathode attributes, specifically (a) a high yield of photoelectrons when under illumination (because it has a short photon absorption length for efficient photon absorption, a long electron diffusion length to minimize photoelectron losses, and a small or negative electron affinity), and (b) high conductivity to avoid charging due to electron loss by photoemission. It has seemed that such desirable attributes could only be realized through the expensive and impermanent Cesium coating step. The result is that the photocathode is chemically unstable. What is needed, therefore, is another way of activating the photocathode that realizes all of the foregoing desirable attributes (high yield and high conductivity) while at the same time providing a structure that is highly stable and robust both chemically and physically (unlike these cesiated structures).

For example, one such material for near to mid UV detection (used in sealed tube configuration with MCPs) is $Cs_2Te$. This material has exceptional. quantum efficiency with peak QE of above 50% at wavelengths between 165-190 nm in the opaque configuration. It is solar blind with a cut off wavelength around 265 nm depending on particular fabrication parameters. The conductivity of $Cs_2Te$, however, is extremely low. To overcome this deficiency, $Cs_2Te$ photocathodes must be thin to allow charge flow from the conductive substrate to the photocathode surface. This reduces the absorption efficiency of the photocathode, but as noted above, very high QE is still achieved with this material. The major drawback of this material for use as a photocathode is its reactivity and consequent instability. Even short term exposure to atmosphere, <5 s, results in degradation of the material performance to the point of inutility. This severe difficulty necessitates stringent fabrication procedures. The current procedure for fabricating photocathode imagers using $Cs_2Te$ involves fabrication of the material., installation of the photocathode into the imager, alignment, and window sealing all in vacuum. Because of this fabrication difficulty, if not for the lack of another material with acceptable QE in the near UV, $Cs_2Te$ would have been abandoned long ago.

The ideal photocathode material must: 1) produce a high yield of photoelectrons when under illumination (i.e., short photon absorption length, long electron diffusion length, and small or negative electron affinity); 2) be conductive to avoid charging due to loss of electrons from photoemission; and 3) be robust both chemically and physically. In addition, it would be desirable to have a material. system that is activated for photoelectron emission as mentioned above in which the photon absorption spectrum can be independently adjusted without compromising or sacrificing any of the foregoing desired attributes. In particular, for some space applications it is important that the sensor be blind to visible light (e.g., from the sun), and therefore it is useful. to be able to set the photon absorption spectrum of the detector to exclude certain wavelength regions while including desired ones.

Inventive Photocathode

Photocathodes for generating electrons in response to incident photons in the DDEBA detector in accordance with the instant invention may take the form of one of either a Piezoelectrically-Enhanced Photocathode (PEPC) or a Delta-doped Enhanced Photocathode (DEPC). Both of these photocathode types take advantage of the near ideal. properties of wide bandgap semiconductor materials. For example, in embodiments of the invention designed to be operated in the UV spectral. range, III-nitride materials are nearly ideal. for photocathode applications. In particular, it has been discovered that III-N materials, and the like, are physically and chemically robust, can be doped both n and p type, and have demonstrated high quantum efficiencies as photocathodes, thereby removing many of the manufacturing and operational. constraints found with conventional. Cs doped photocathode materials.

Stability of the Surface

The surfaces of III-N materials, such as GaN, have been found to be extremely stable. (See, Bermudez, *J. Appl. Phys.*, 80, 1190, (1996).) For example, the oxidation of GaN terminates after approximately one monolayer with no significant progression of this oxidation until temperatures in excess of 700° C. This stability reduces the stringent fabrication and operation requirements associated with Cs containing compounds especially in the near UV range.

Low Level of Surface States

III-N materials such as GaN surface have also been found to possess a low level of surface states. (See, P.M. Bridger, et al., *Appl. Phys. Lett.*, 74, 3522 (1999); and Schmitz A C, et al., *J. Elec. Mat.*, 27: (4) 255-260 April 1998, the disclosures of each of which are incorporated herein by reference.) This allows for the modification of the surface barrier for electron emission by suitable modification of the semiconductor surface. Lowering the surface electron affinity significantly improves the emission efficiency of photocathodes. This modification is typically achieved by deposition of a monolayer of Cs or CsO. The surface dipole created by this thin layer of electropositive material. leads to significant band bending near the surface, resulting in negative electron affinity (NEA), where the bulk conduction band minimum lies above the vacuum level. Electrons excited within the bulk can diffuse to the high field region near the surface where they can tunnel., or be ballistically emitted from the crystal.

The nitrides are excellent candidates for this type of surface energy engineering given their already low electron affinities. P-type GaN has been shown to have near zero effective electron affinity, and sub-monolayer adsorption of Cs results in further reduction in its electron affinity, reaching −2.1 eV by the completion of the first monolayer. (See, M. Eyckeler, et al., *JVST B*, 16 (4) 2224 1998, the disclosure of which is incorporated herein by reference.) AlN has been reported to have negative electron affinity as deposited or cesiated. (See, M. C. Benjamin, et al., *Appl. Phys. Lett.*, 64, 13 (1994); and C.

I. Wu and A. Kahn, *Appl. Phys. Lett.*, 74 (10) 1433 (1999), the disclosure of each of which are incorporated herein by reference.)

In particular, these results indicate that the AlGaN alloys are good candidates for photoemissive elements such as photocathodes. MBE grown p-GaN:Cs photocathodes have been found to possess a very high QE of 40-50%. (See, F. Machuca, et al., *J. Vac. Sci. Technol. B*, 18, (6), 3042 (2000), the disclosure of which are incorporated herein by reference.) This is approximately equal. to the efficiency reported for $Cs_2Te$. The passive nature of the nitride surfaces has a significant advantage over the Cs containing materials where exposure to oxygen quickly degrades the surface properties and consequently the emissive properties of the device. In conjunction with this chemical. stability, the thermal. stability of nitride surfaces will allow for thermal. degassing of air exposed III-N photocathode materials; this would be a tremendous improvement over the processing and implementation requirements of currently employed materials.

Tailorable Bandgap

With band gaps ranging from 3.4 eV to 6.2 eV, the AlGaN ternary system allows for a tailored energy cutoff of absorption between near and mid UV radiation. This selectivity has been employed to produce GaN ultraviolet sensors with UV to visible sensitivity ratio of $>10^5$. (See, M. Asif Khan, et al., *Appl. Phys. Lett.*, 60 (23), 2917 (1992), the disclosure of which is incorporated herein by reference.) This inherent visible-blind attribute makes this material. nearly ideal. for use as a UV photocathode. However, the tailorable bandgap also means that it will be possible to develop materials capable of operating at nearly any wavelength from the near-IR to the UV.

Direct Bandgap

Figure 4:
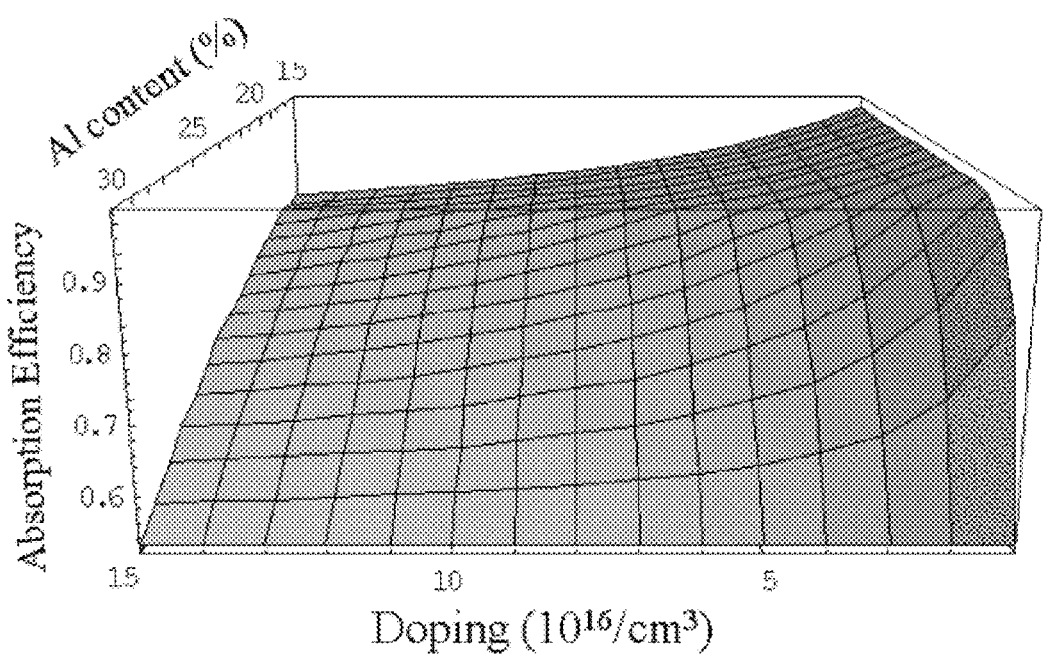
FIG. 4 provides a data graph showing the fraction of photons absorbed within the active surface region of an AlGaN heterostructure showing very high efficiencies of ~85%.

It has been shown that III-N materials have direct bandgaps. This allows for energy cutoff selectivity without the detrimental. reduction in absorption coefficient associated with an indirect bandgap. The higher quantum efficiency associated with direct band gap materials is critically important for applications involving low light level imaging. For example, FIG. 4 shows the calculated absorption efficiency for AlGaN photocathodes, where the Al. fraction in the base layer is 0.3 for this calculation. As shown in this data graph, AlGaN crystals have an absorption efficiency of 85%, indicating improved detection properties for low-energy electrons of the type contemplate for detection by the DDEBA detectors of the instant invention.

PEPC PhotoCathodes

In general. terms, PEPC photocathodes include a base layer having a first lattice structure and an active layer having a second lattice structure and epitaxially formed on the base layer, the first and second lattice structures being sufficiently different to create a strain in the active layer with a corresponding piezoelectrically induced polarization field in the active layer, the active layer having a band gap energy corresponding to a desired photon energy. In one implementation, the base and active layers are each formed of p-type AlGaN, and the aluminum mole fraction in the base layer exceeds the aluminum mole fraction in the active layer by an amount sufficient to create the strain. In this implementation, the aluminum mole fraction of said active layer fixes the band gap energy and corresponding spectral. cut-off frequency of said photocathode, and the aluminum mole fraction x of said base layer is selected to provide the requisite difference between the mole fractions. (PEPC photocathodes of a type compatible with the EBAPS have been previously described in U.S. Pat. No. 7,592,747, the disclosure of which is incorporated herein by reference.)

DEPC Photocathodes

An alternate and more stable (permanent) method for producing a surface dipole similar to that obtained through deposition of Cs is through delta doping. To realize the high stability, and to attain QE in excess of 50%, a Fully Depleted Della-doped PhotoCathode (FDDPC) housed in GaN has been developed. Unlike the conventional. cesiated photocathodes mentioned above, this design does not require an unstable, low work-function metal. coating. Instead, the DEPC or FDDPC is a novel. photocathode formed of a doped column III-nitride (III-N) material. Doping-induced bandstructure engineering producing Negative Electron Affinity (NEA), allows for activating photocathodes without Cs. Moreover, new advances in the growth of III-Nitrides make it possible to achieve ultrathin near-surface layer with high charge concentration using high levels of dopant incorporation.

Figure 5A:
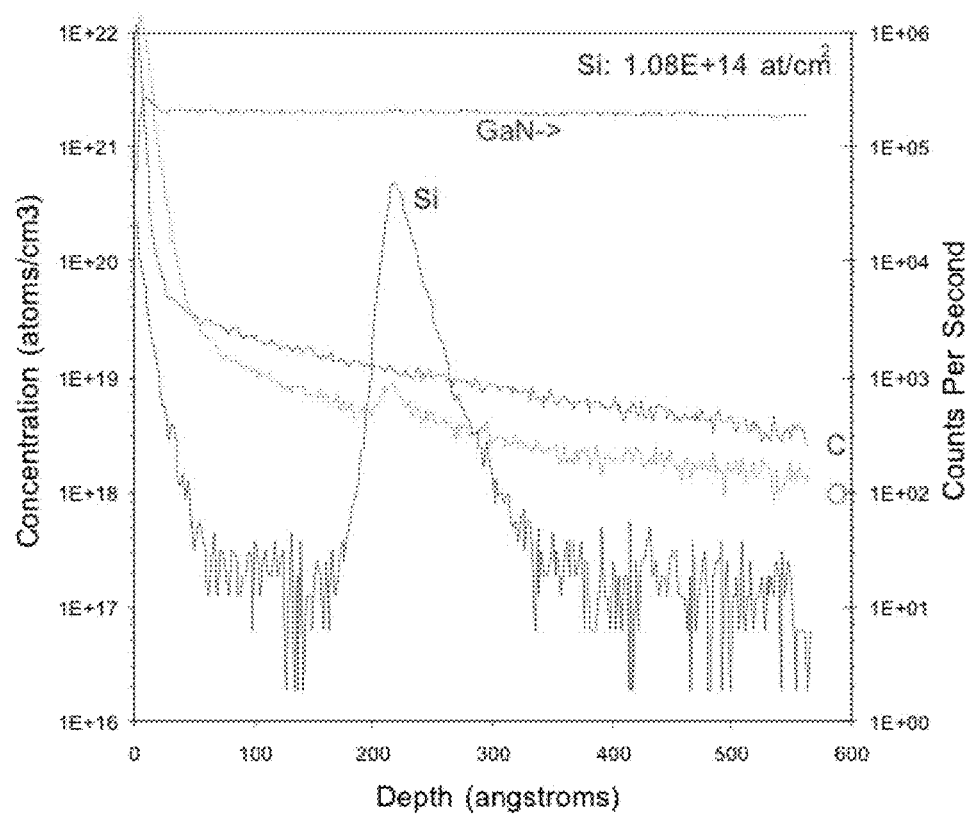
FIG. 5a provides a data graph showing a Secondary Ion Mass Spectrometry (SIMS) of a delta layer produced on the surface of GaN surface.
Figure 5B:
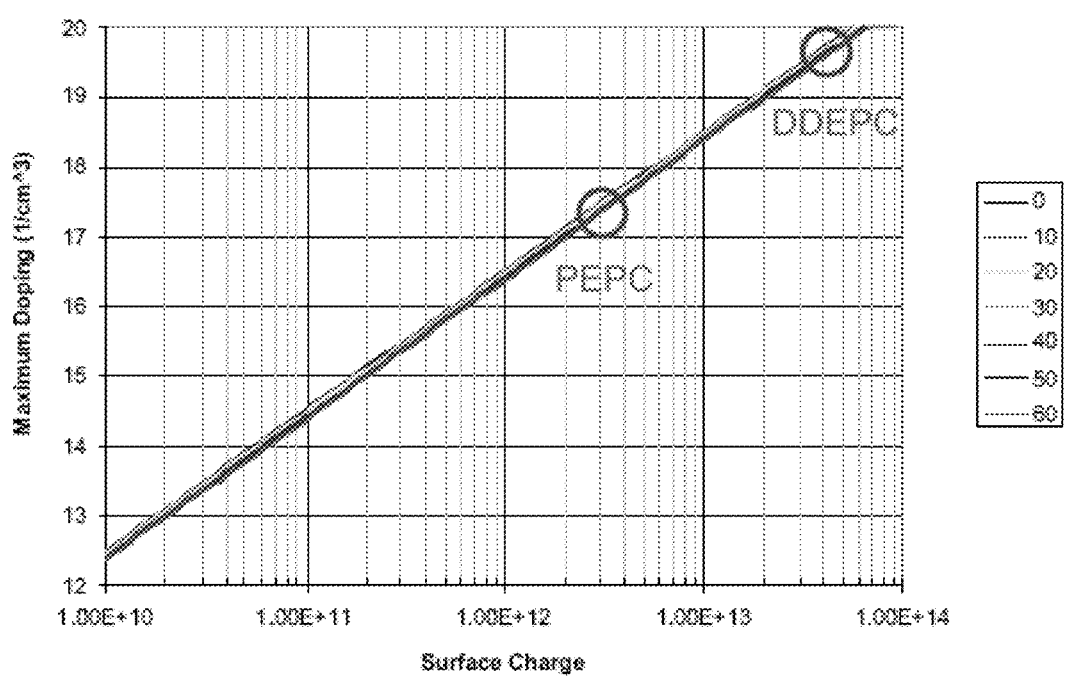
FIG. 5b provides a model showing the relative doping levels of PEPC and DEPC photocathodes in accordance with the current invention FIG. 6a provides a data graph showing the reduction in electron emission threshold with the introduction of a doped layer in accordance with the current invention.
Figure 6A:
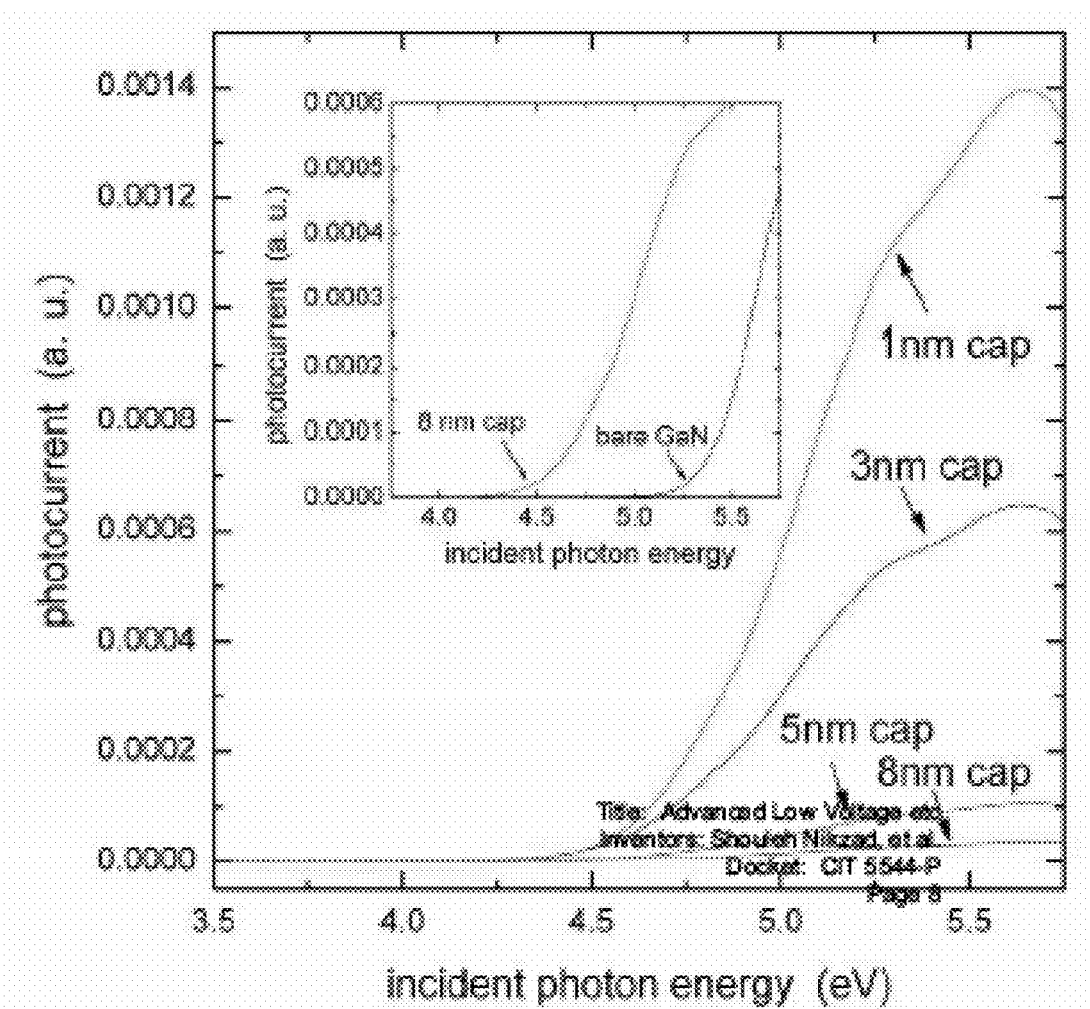
FIG. 6b provides a schematic of a band diagram for a near surface delta-doped GaN photocathode.
Figure 6B:
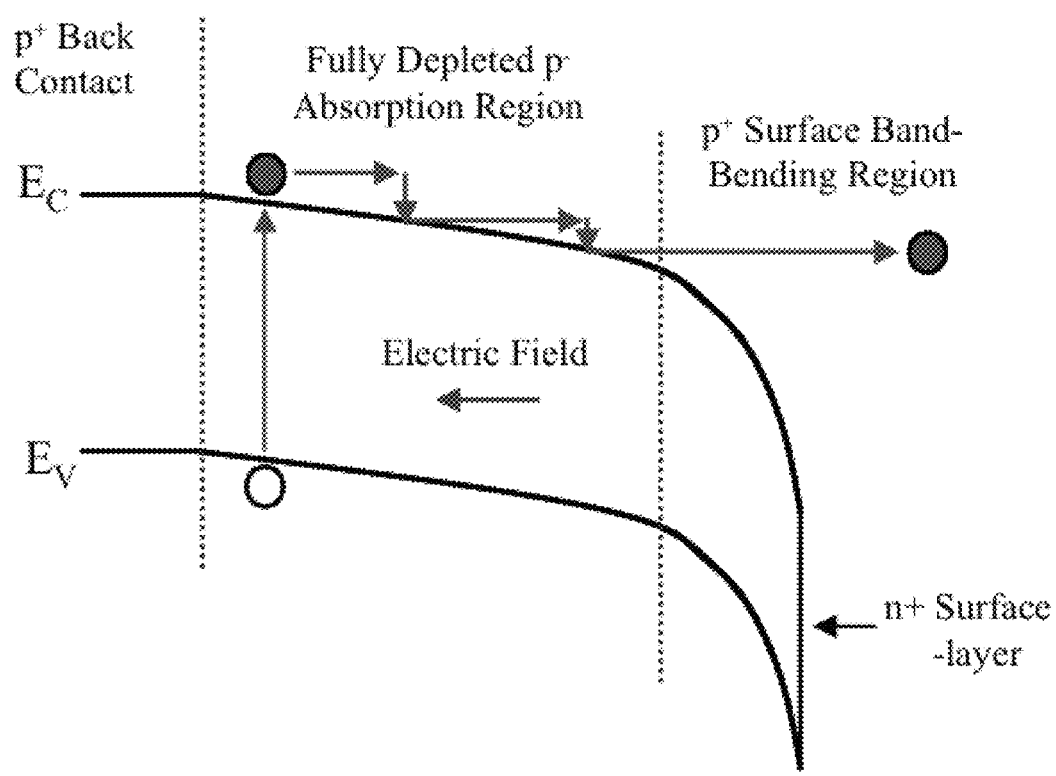

In particular, using MBE the means have been developed to create ultra-confined (<1 nm FWHM) Si-doped delta layers in GaN with activated sheet carrier densities in excess of $1.25 \times 10^{14}$ electrons/$cm^2$. FIG. 5a shows data from Secondary Ion Mass Spectrometry (SIMS) showing the composition of a delta layer produced on the surface of GaN surface, and FIG. 5b shows the doping levels and carrier density of delta doped materials in comparison with PEDC photocathodes. It has been shown that the insertion of this sheet charge into the material. causes the bands to bend downward strongly, as shown schematically in FIG. 6a. In turn, this causes the electrostatic potential. drop from the bulk of the semiconductor to the surface to be almost the entire bandgap, as shown in the data graph in FIG. 6b. (See, R. Strittmatter, et al., (2004), cited above.)

Since the bandgap (3.4 eV) exceeds the electron affinity (2.7-3.1 eV), the vacuum level outside the semiconductor will lie below the conduction band minimum in the bulk, creating the same effective negative electron affinity exhibited by cesiated photocathodes. In this state, electrons that are photogenerated in the bulk p-type region can diffuse to the depletion region, whereupon large built-in fields accelerate them toward the surface. Provided the photoelectrons do not scatter inelastically during this transit, they reach the surface with sufficient energy to escape into the vacuum. For high QE, the depletion region must therefore be short in comparison to the inelastic mean free path, requiring large p-type doping levels in the range of $10^{19}/cm^3$. This p-type doping density, and the counter-balancing sheet charge density required in the n-type delta layer, are both readily attainable in GaN today.

Figure 7A:
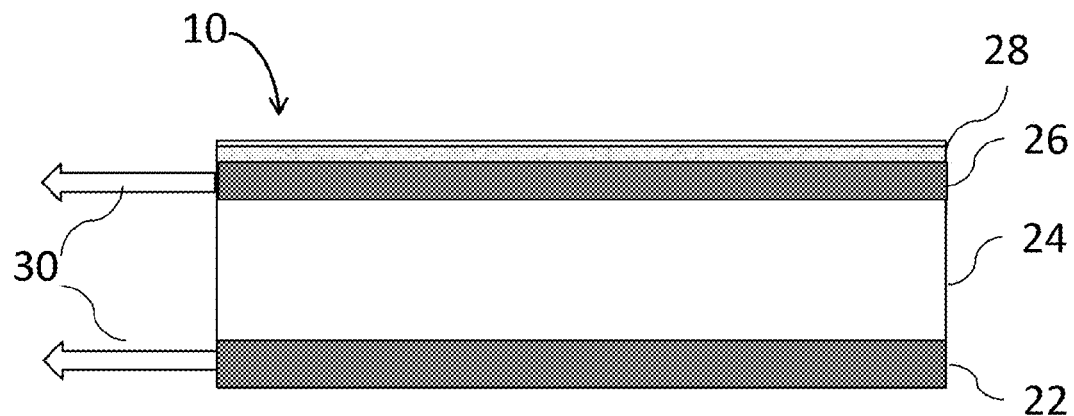
FIG. 7a provides a schematic of a FDDPC in accordance with the current invention.
Figure 7B:
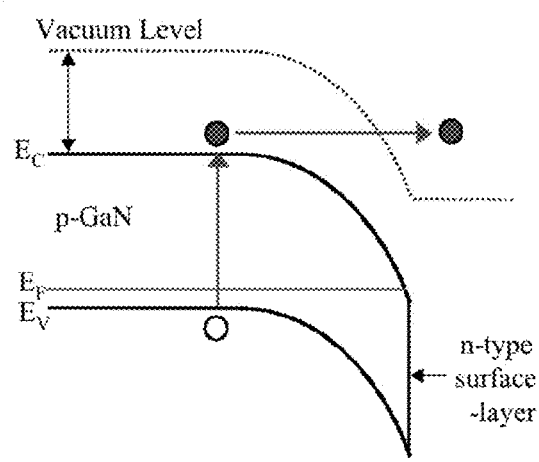
FIG. 7b provides a schematic band diagram for a FDDPC biased to fully deplete the photon absorption region.

In short, it has now been discovered that delta doping produces a conductive layer that provides a critical. electrical contact to the surface, which allows the surface to be reverse biased with respect to the bulk. FIG. 7a shows a schematic of an exemplary FDDPC in accordance with the invention. As shown, in one embodiment, an FDDPC in accordance with the current invention may consist of a p-GaN substrate with an n-type delta-doped layer in close proximity to the surface (~2 nm). In this embodiment, as shown in the diagram, a GaN FDDPC (21) is proposed, which consists of four epitaxial. layers: a thin, highly doped p-type back contact layer (22); a thicker (~300 nm) lightly doped p-type photon absorption region (24); a thin highly p-type doped band-bending region (26); and an ultra-thin n-type delta-layer near the surface (28). Separate electrical contacts are made to the p-type back contact layer and the surface "inversion" layer by means of lateral contacts (30) on the photocathode periphery. By applying a few volts dc bias between these contacts, the downward band-bending (FIG. 7b) can be extended all the way to the back contact layer, causing the absorption region to become fully depleted. Instead of diffusing by means of a random walk, photogenerated electrons are now drawn to the emitting surface with almost no loss from recombination. In this way, fully depleted delta-doped photocathodes can surpass the theoretical 50% internal QE that limits conventional semiconductor photocathodes.

All of the favorable attributes of the III-Nitride materials, in conjunction with the novel delta doped NEA design, allows for the formation of FDDPC photocathodes that are stable, highly efficient, and easily fabricated. With the novel growth, modeling, and characterization capabilities, it is possible to fabricate, characterize, and optimize GaN and AlGaN FDDPC structures using rf-plasma assisted MBE and incorporate processed devices in EB imagers. Accordingly, in one exemplary embodiment, the photocathode of the DDEBA of the invention is formed of AlGaN, which is stable (not requiring sealed tube technology), efficient (~50%), and solar blind (with a cutoff between 250 and 350 nm depending on the Al/Ga composition).

One skilled in the art will understand that modifying the composition allows for the tailoring of the electronic properties of the material. As such, any III-N composition compatible with the DDEBA detector of the instant invention may be used. In addition, it will be understood that other semiconductor materials may be chosen for other detector purposes such that electrons are emitted when photons of a desired wavelength impinge thereon. For example, in IR applications the photocathode material. may be formed from a material. selected from GaSb, InGaAs, InAs, or a superlattice of GaInAlSb and InAs, or a mixture thereof. Examples of such materials are found, for example, in U.S. Pat. No. 5,404,026. Likewise, GaAs can be used as a photocathode materials for a wide spectral. range from the ultraviolet to 930 nm, and InGaAs can provide sensitivity from 900 to 1000 nm and extended sensitivity in the infrared range. Accordingly, it will be understood that one of ordinary skill in the art may select any non-cesiated semiconductor material. appropriate for use in the current detector to provide sensitivity to photons within a desired spectral. range.

Delta-Doped Detector Arrays

As previously discussed, conventional. EBCCDs require high voltage operation (10-20 keV) in part due to the inability of conventional. CCDs to detect low-energy electrons. Delta doped arrays have been shown to detect electrons with energies as low as 100 eV. (See, S. Nikzad, et al., *Applied Physics Letters* (2005), the disclosure of which is incorporated herein by reference.) Delta doping is a technique that was developed to modify the bandstructure of back-illuminated silicon CCDs, initially, for enhancing the UV response (delta-doped CCDs exhibit QE at the theoretical. limit of silicon transmittance in the UV). (See, M. E. Hoenk, et al., *Proc. of SPIE*, 1656, 488 (1992); M. E. Hoenk, et al., *Appl. Phys. Lett.*, 61, 1084 (1992); S. Nikzad, et al., *Proc. of SPIE*, 2198, 907 (1994).; and S. Nikzad, et al., *Proc. of SPIE*, 2217, 355 (1994), the disclosure of which is incorporated herein by reference.)

The term "delta doping" in the MBE jargon comes about because the doping profile of high magnitude but thin width resembles the mathematical. delta function. With a surface charge density of ~$2 \times 10^{14}$ Boron/cm$^2$, delta-doping creates very high electric fields near the surface that drive photogenerated charge away from the back surface and suppress the generation of excess dark current from the exposed silicon surface. Because this layer is extremely thin, essentially all of the photogenerated charge can be detected, even when the incident light is absorbed very near the surface. The current invention demonstrates that delta-doped arrays (including either CCD or CMOS device architectures) can also be used as excellent low-energy electron detectors. (See, S. Nikzad, et al., *Applied Physics Letters*, 73, 3417 (1998); and S. Nikzad, *Applied Physics Letters* (2005), the disclosures of which are incorporated herein by reference.)

Delta-Doped CCD Detector

Figure 8A:
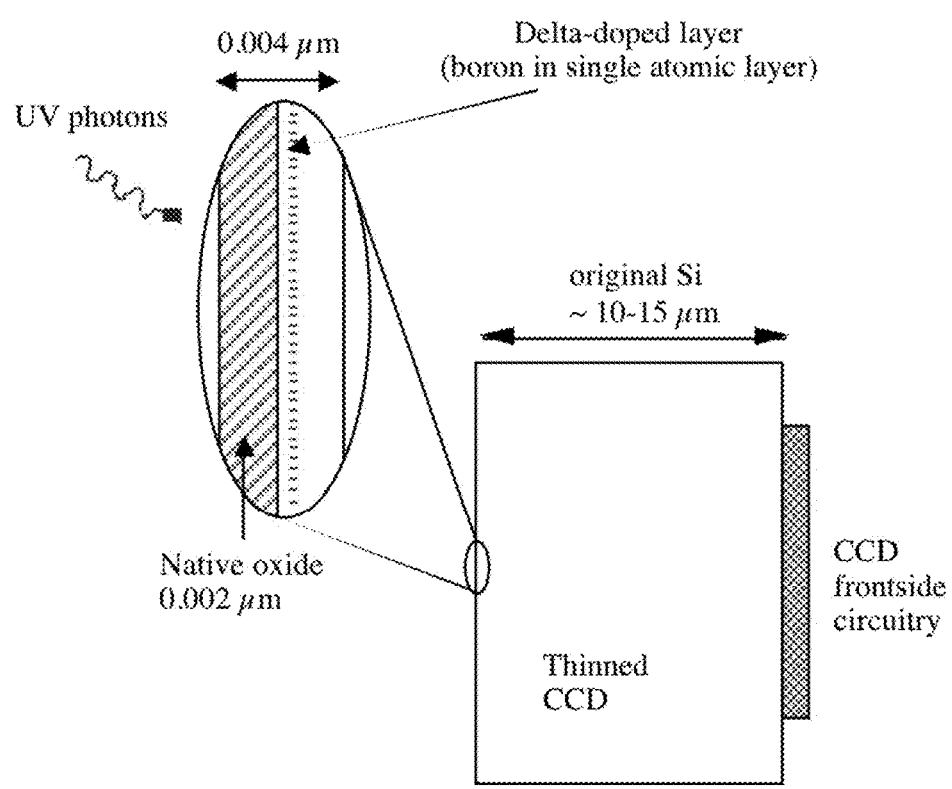
FIG. 8a provides a cross section schematic of a delta-doped CCD in accordance with an embodiment of the current invention.
Figure 8B:
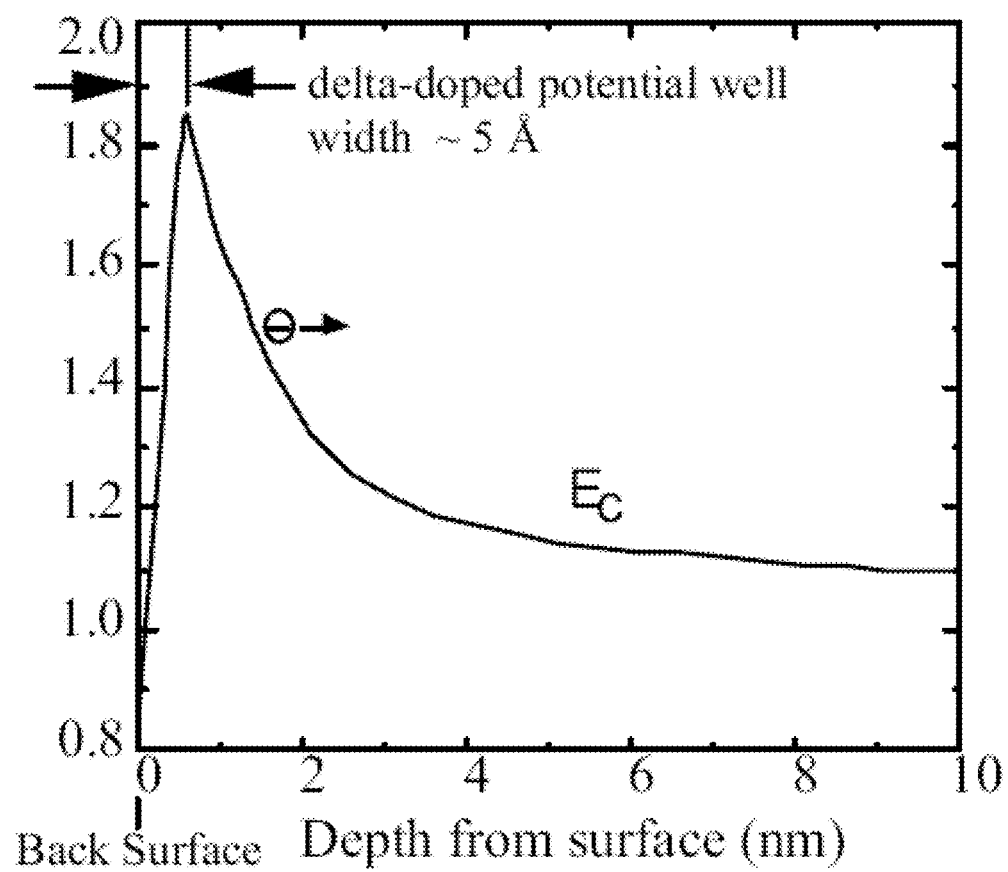
FIG. 8b provides a model. calculation showing the depth profile of the delta doped CCD in accordance with an embodiment of the current invention.

In the current invention, the detector array used in the DDEBA detector may incorporate a delta-doped CCD. In such an embodiment, molecular beam epitaxy (MBE) is used to grow ~2 nm of single-crystal silicon on the backside of the CCD, while incorporating a sheet of $2 \times 10^{14}$ boron atoms/cm$^2$ (nominally a single monolayer of the crystal.) at a precise location ~1 nm from the silicon-silicon dioxide interface at the back surface. (See, M. E. Hoenk (1992), cited above.) FIG. 8a schematically illustrates the structure grown on the back surface of a thinned CCD, and FIG. 8b shows the depth profile of the device. (Further details of the fabrication and operation of delta-doped CCDs can be found in U.S. Pat. Nos. 6,278,119 and 6,403,963, the disclosures of each of which are incorporated herein by reference.) One skilled in the art will understand that modifying the doping levels and layer thicknesses in the delta-doped layer allows for the tailoring of the electronic properties of the material.

Figure 9A:
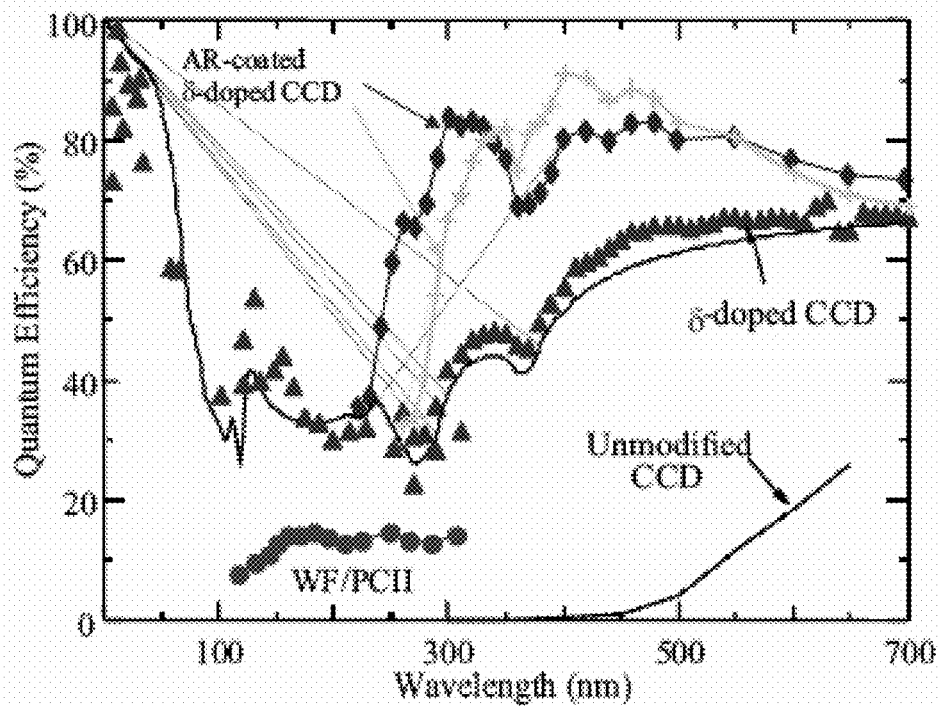
FIGS. 9a to 9d provides data graphs showing the detection properties of delta doped CCDs in accordance with an embodiment of the current invention.
Figure 9B:
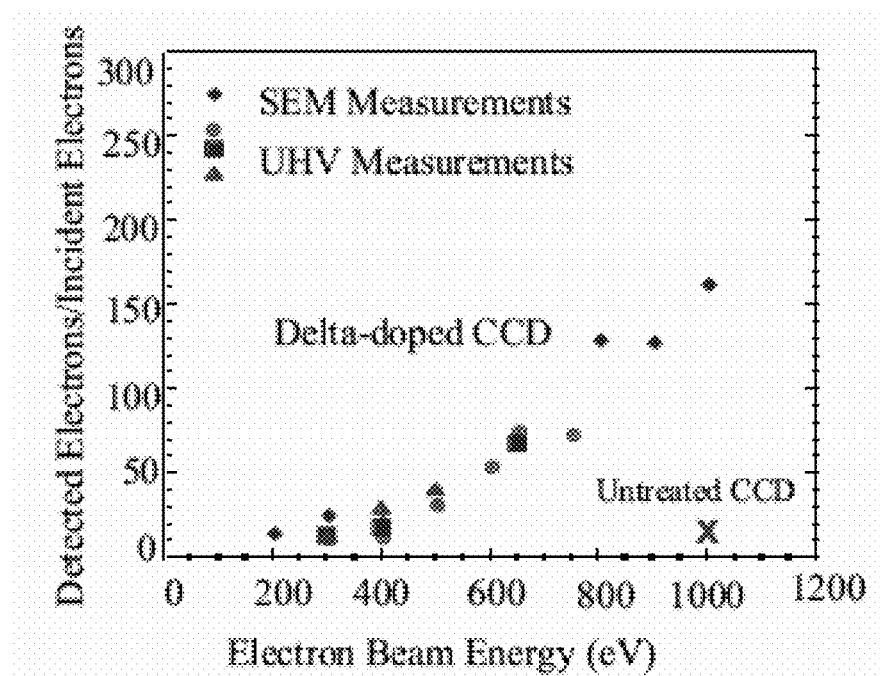
Figure 9C:
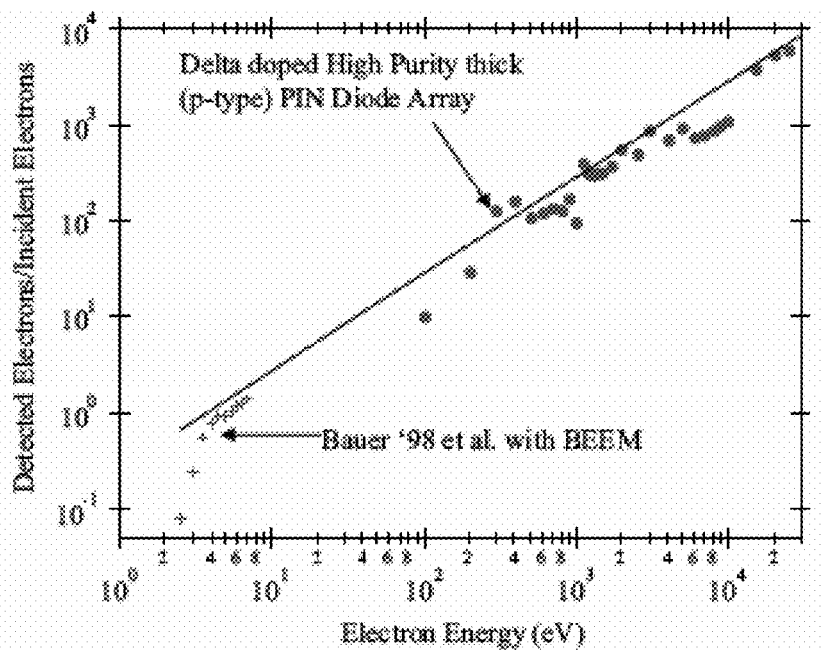
Figure 9D:
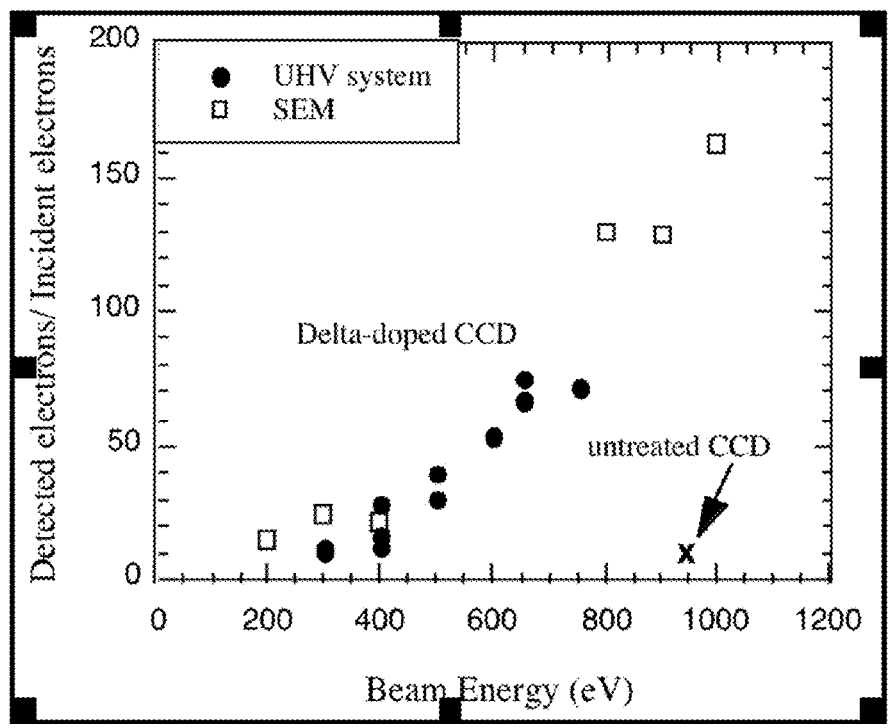

The response of delta-doped CCDs to low-energy electrons in accordance with the current invention has been measured. (See, S. Nikzad, et al., "Recent Results with Della-doped CCDs", Proceedings of the 1997 IEEE Workshop on CCDs & Advanced Imaging Sensors, (1997); and S. Nikzad, et al., *Proc. of SPIE*, 3019, 241 (1997), the disclosures of each of which are incorporated herein by reference.) FIGS. 9a to 9d show results of some of these experiments. In particular, FIG. 9a shows the dramatically improved quantum efficiency of the delta-doped CCDs in accordance with the invention when compared to unmodified CCDs. (See, Hoenk, et al., *Applied Physics Letter,* 61:1084 (1992), the disclosure of which is incorporated herein by reference.) FIG. 9b, meanwhile, shows the remarkable low-energy electron detection threshold of these delta-doped CCDs. In particular, it has now been demonstrated that the detection of electrons at energies as low as 100 eV, which is the lowest energy that the test electron source could produce, is possible. (See, S. Nikzad (2005), cited above; and S. Nikzad, et al., *Applied Physics Letters*, 73, 3417 (1998), the disclosures of which are incorporated herein by reference.) Moreover, as shown in FIG. 9c, the delta-doped CCDs of the invention are able to detect electrons over a very wide energy range, namely, from ~$10^2$ to over $10^4$ eV. (See, S. Nikzad, et al., *Applied Physics Letters*, 89, 182114 (2006), the disclosure of which is incorporated herein by reference.) Finally, FIG. 9d shows that the response of the device increases with increasing energy due to multiple electron-hole pair production. The significance of these measurements is that they conclusively demonstrate the high efficiency and low-energy threshold of the device for detecting electrons.

Figure 10:
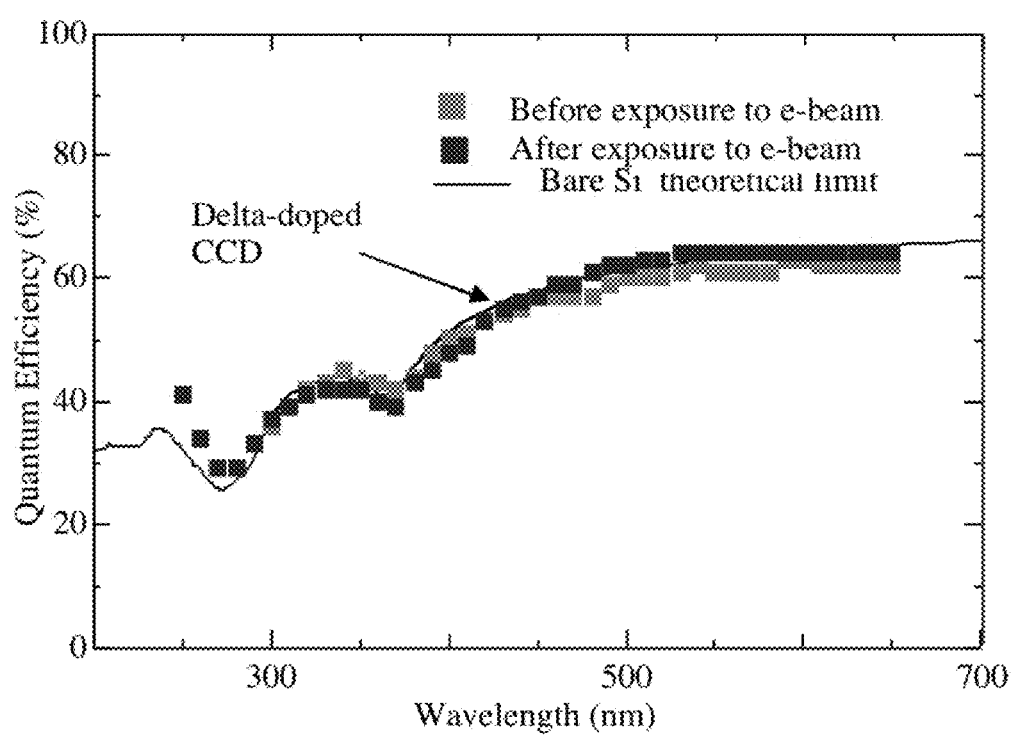
FIG. 10 provides a data graph of a stability of delta-doping treatment in exposure to electrons for a CCD in accordance with an embodiment of the current invention.

The stability of delta-doped detectors (or stability of the bandstructure modification using delta-doping technology) has also been measured by various groups as a function of time, temperature, illumination history and ambient gases with no observed change in the QE. (See, J. M. Jenkins, et al., "High Precision photometry with Back-illuminated CCDs", in ASP Conf. Ser. *Planets Beyond Our Solar System and Next Generation Space Missions*, Ed. D. Sodarblum, 277-280 (1997); J. Janesick, et al., *Proceedings of the SPIE*, 1071, 153 (1989); and S. Nikzad, et al., (1997), the disclosures of each of which are incorporated herein by reference.) FIG. 10 shows the stability of the delta doping treatment of the CCD after exposure to electrons. The QE stability of the delta-doped CCD in the UV was examined after exposure to electrons in the energy range 50-1500 eV. As shown, measurements before and after the exposure to 1500 eV electrons for two hours at fluxes of approximately 1 nA/cm$^2$ showed no degradation in the UV QE. (See, S. Nikzad, et al. (1998), cited above.)

Accordingly, the delta-doped CCD detector arrays of the instant invention provide the low-energy electron detection capability and stability necessary to allow for the creation of a compact, highly efficient, low light level. DDEBA detector as described herein.

Delta-doped CMOS Active Pixel Sensors

Figure 11:
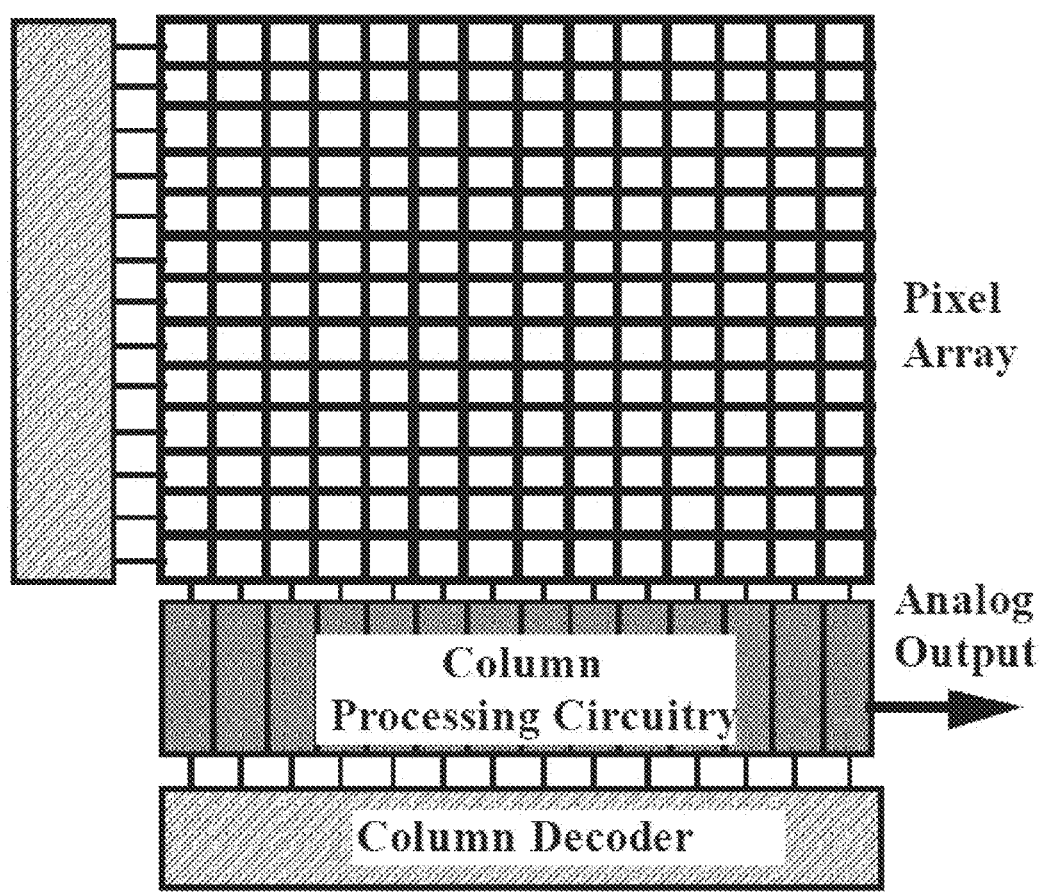
FIG. 11 provides a schematic of a CMOS APS detector array in accordance with an embodiment of the invention.

CMOS active pixel. sensor (APS) imaging arrays are arrays of silicon detectors in which each element of the array contains at least one transistor operating as an active device, that is, as an active amplifier rather than simply as a switch. In contrast to CCDs, which transfer collected charge serially to a small number of on-chip readout amplifiers, CMOS APS arrays operate with a parallel. readout architecture similar to a Dynamic Random Access Memory (DRAM) chip. Within each pixel, an integrated amplifier converts the signal. charge to a voltage for temporary in-pixel storage, as shown schematically in FIG. 11. Random access readout is enabled by an array of select switches connected in parallel. to the rows and columns of CMOS APS pixels. CMOS Readout Integrated Circuits (ROICs) with a similar architecture have been used for decades in infrared sensors, but the chip area necessarily devoted to signal. processing initially placed impracticable limits on pixel. size for CMOS APS imagers. (See, Hoenk, M. E., et al., *Proceeding SPIE*, 7419B-34, 2009, the disclosure of which is incorporated herein by reference.) Because the detector is made in a standard CMOS process, all timing and control. circuitry necessary for readout can be integrated on-chip. In addition, application-specific signal-processing circuits can be integrated into the design to add customized data-processing functions for particular applications. Another advantage for scientific imaging is the low power dissipation of CMOS imaging arrays, typically in the range of milliwatts or tens of milliwatts.

As with CCDs, light incident on CMOS APS arrays may be scattered or absorbed in the front surface structures that make up the array electronics. In addition, CMOS APS arrays suffer from an additional. loss of efficiency because the light-sensitive photodiodes occupy only part of the surface, the remainder of the surface being devoted to the transistors necessary for detection, signal. processing, and readout. While it is possible to recover part of these losses using antireflection coatings and lenses, back illumination offers far better performance for scientific CMOS imaging arrays, including higher quantum efficiency, potentially 100% fill factor, and sensitivity in the ultraviolet.

From a materials science standpoint, the back surfaces of thinned CCDs and CMOS imaging arrays are identical. The commonalities of CMOS imaging arrays and CCDs are such that the processes developed for delta-doping CCDs, described above, apply equally well to CMOS devices. Despite the similarities, there are differences between the two device architectures relevant to the thinning and back illumination. One minor difference lies in the relative thicknesses of CCDs and CMOS arrays. The epilayer thickness in a standard CMOS process is only 5 microns in thickness, compared to the 10-15 micron epilayer thickness of typical. CCDs. This makes the thinning process slightly more difficult for CMOS devices, the tolerances for thinning uniformity are tighter for the thinner membranes. In addition, after thinning the depletion edge of the front surface structures reaches the back surface in some areas of the device, so that prior to delta-doping, thinned CMOS arrays were found to be saturated with dark current at room temperature, and hence inoperable. Delta-doped, back-illuminated CMOS arrays did not exhibit any excess dark current, because the back surface defects are fully passivated by the delta-doping process. In addition, it should be noted that the more complicated pixel. structure of CMOS APS arrays leads to a requirement that these devices be optimized for back illumination, in order that the three dimensional. electronic potential. in the pixels causes all of the signal. charge to be collected at the sense nodes in the array. Absent such optimization, some of the signal. charge may not be detected, and the potential. with back illumination for achieving 100% fill factor will not be realized.

Figure 12:
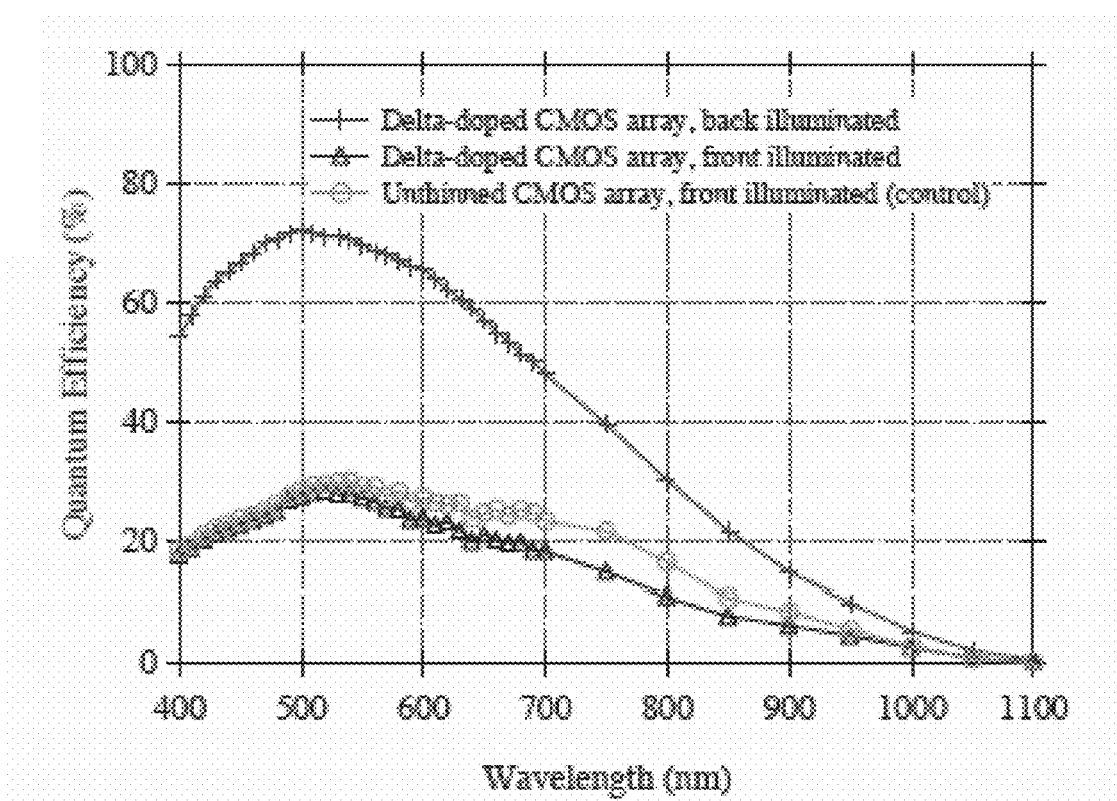
FIG. 12 provides a data graph showing the quantum efficiency of a delta-doped CMOS imaging array in accordance with an embodiment of the invention.

Although CMOS imagers are low power and their digital. interface makes them easy to integrate into systems, the noise performance of most CMOS imagers is significantly inferior to CCDs. A low noise scientific CCD may have an input referred noise of 2 to 4 electrons, compared with 10 to 50 for CMOS imagers. However, the physics of the electron bombardment technique used in accordance with the DDEBAPS detectors of the instant invention result in a gain with a sub-Poisson noise. That is, the noise is shot noise divided by a quantity known as the Fano factor. This multiplication is before and independent of the readout, so the readout noise is not multiplied by the gain factor. Typically with high-energy processes in silicon, one electron-hole pair is generated for every 3.6 eV of incident energy. For an electron acceleration of 1 keV, each electron liberated from the photocathode will generate approximately 270 electron-hole pairs in the silicon. The signal. generated per incident photon would therefore be significantly greater than the read noise, and even if the pixel. read noise was 50 electrons, as a whole the electron bombarded imager would have an input referred noise of 0.2 electrons. Accordingly, using a frame-thinning approach originally developed for CCDs, it is possible to demonstrate high quantum efficiency in delta-doped CMOS arrays (FIG. 12). This data show that reflection limited quantum efficiency is also attainable in delta-doped CMOS APS imaging detectors, just as with delta-doped CCDs. Accordingly, the detector array for use with the DDEBA detector of the current invention may also take the form of a delta-doped CMOS APS device.

The development of an electron bombarded delta-doped CMOS APS would complement the development of electron-bombarded delta-doped CCDs, providing the following new capabilities:

Ultra-low Power Imaging

The replacement of the MCPs would reduce the power in an EBCCD structure from tens or hundreds of watts down to a few watts. The use of a CMOS APS imager will further reduce the power by more than an order of magnitude, down to tens of milliwatts. This could be enabling on battery powered missions or miniature planetary rovers.

Random-Access Capability of CMOS APS Imagers

The random-access capability of CMOS APS imagers allows a window-of-interest to be scanned rapidly, as opposed to a purely sequential. device like a CCD. A CMOS APS imager is read out in a raster-scan fashion by connecting to each pixel. in turn and reading out the analog signal. voltage, similar to how the digital. signal. is read out in a dynamic random-access memory.

Signal Processing on the CMOS APS Chip

Signal. processing could be incorporated into the CMOS APS array to greatly enhance the performance of instruments such as UV Raman spectrometers. For example, using a grating spectrometer it is possible to correlate the resulting spectra in on-chip hardware against the spectral. template of a known mineral. or minerals. This can report very rapidly the presence and concentration of chemicals of interest.

EXEMPLARY EMBODIMENTS

The person skilled in the art will recognize that additional embodiments according to the invention are contemplated as being within the scope of the foregoing generic disclosure, and no disclaimer is in any way intended by the foregoing, non-limiting examples.

Example 1

DDCCD Detector Array

Figure 13A:
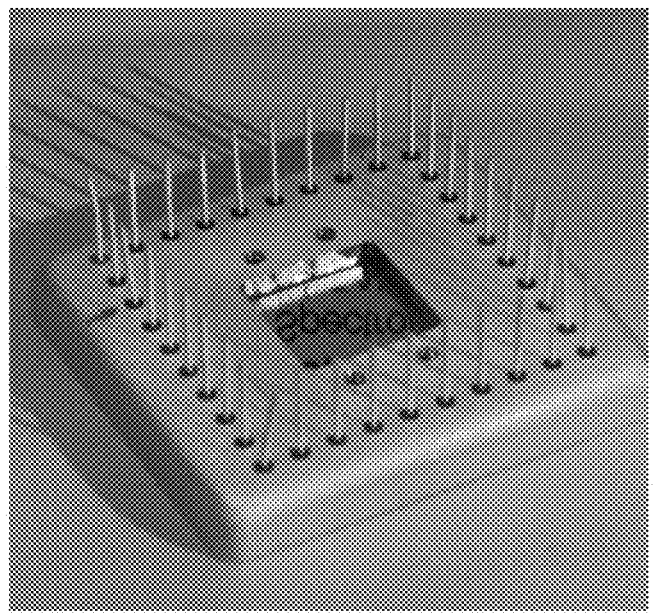
FIGS. 13a and 13b provide images of exemplary thinned, packaged delta-doped 1 k×1 k CCD (13a), and a thinned 1 k×1 k APS (13b, front and back) in accordance with an embodiment of the invention.
Figure 13B:
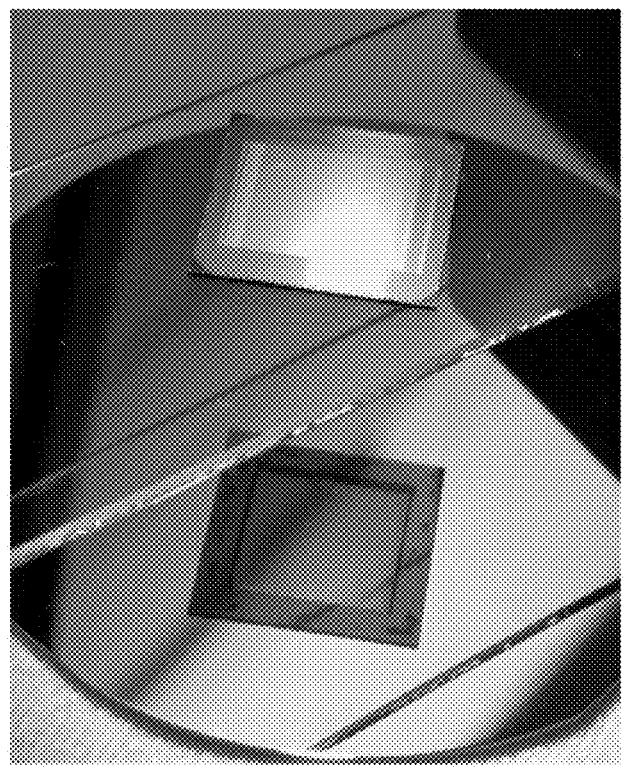
Figure 14:
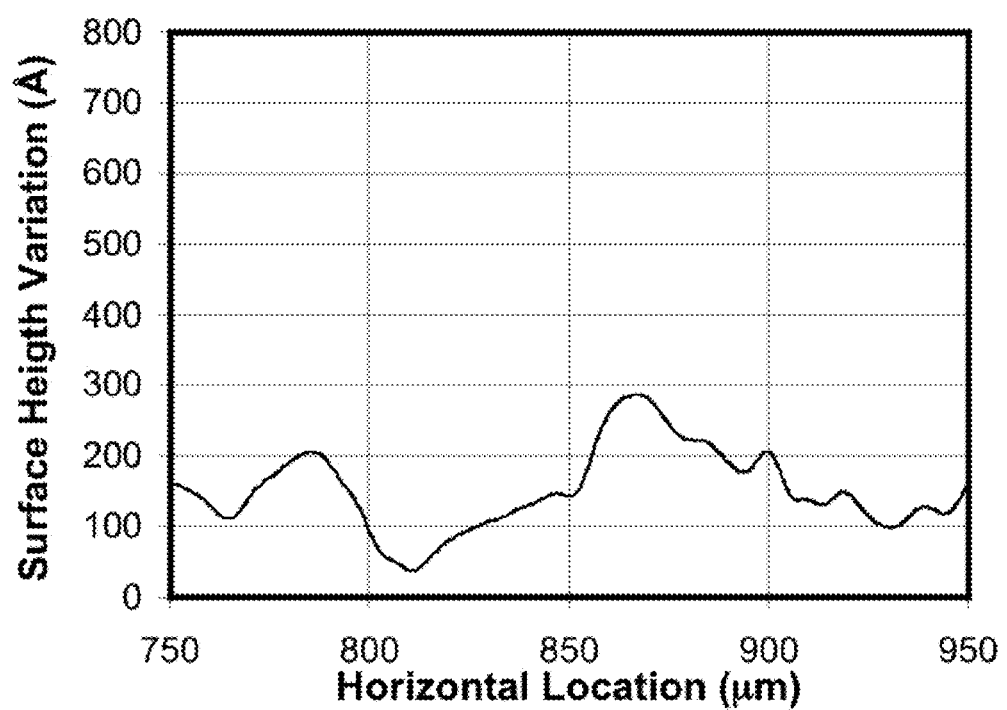
FIG. 14 provides a data graph of a surface scan showing the local roughness in the etched well of the exemplary CCDs shown in FIGS. 13a and 13b.

A versatile thinning approach that can accommodate detectors with various formats and structures and is compatible with die or wafer format has been developed for the production of DDCCD detector arrays in accordance with the current invention. (See, T. J. Jones, et al., *Proc. Of SPIE*, 3965, January (2000), the disclosure of which is incorporated herein by reference.) FIGS. 13a and b qualitatively shows the specular surface of a thinned packaged delta-doped CCD in accordance with this invention. Surface profilometry has been used to quantify the optical. flatness of the thinned CCD. Nine 10-mm scans were made across the surface of an etched CCD. FIG. 14 shows a 200-μm segment of a line scan, which is typical. of the entire etched surface. The data show a 200 Å peak-to-peak variation in the height of the etch surface. This degree of flatness is suitable for the demanding requirements of optics in space instruments.

Example 2

Proximity Focusing and Visible Light Rejection

The large reduction in required electron energies to produce a detectable signal., in accordance with the current invention makes possible a radical. simplification of the conventional. EBCCD architecture. Since lateral photoelectron energies are a few eV, resolutions of 20-30 microns can be achieved with a proximity-focused design in which the semitransparent photocathode is separated from the CMOS or CCD by a few hundred microns and with a 500-1000V potential. The permanent magnet, which is used in conventional. EBCCDs, is deleted in this configuration. Thus a very compact device can be produced as shown in FIGS. 13a and b. However, one issue remains, namely, visible light rejection. In the DDEBA design of the current invention, the photocathode absorbs photons (whether UV or near-IR) producing electrons that are detected in the delta doped APS with a voltage dependent gain (typically 300). At the same time, visible photons will be transmitted through the semitransparent photocathode to be detected with unity gain in the electron detection array (note that visible light detection is always an issue in conventional. EBCCDs). Visible light photons therefore represent noise, similar to but somewhat distinct from array read and dark noises To properly configure the detector, it is necessary to know if visible light can degrade the detection sensitivity for UV photon events, and can multiple visible light coincidences be mistaken for a single UV generated event. Each UV event produces a distinctive event signature, both in amplitude and footprint. In order to significantly affect detection, there would need to be more than 100 visible light photons in a single frame over the footprint of the UV event (conservatively 4 pixels). To address this it is possible to operate standard detectors no slower than video rates, and usually faster. At 30 Hz, this would require a visible light rate of 750 electrons/pixel/sec. In some applications, such as those used for space purposes, even in broadband imaging in a comparatively fast optical. system, visible light backgrounds would be far lower. For example, a fast f/5.0 optical. system operating as a broadband imager sensitive to 130-800 nm, a system efficiency of 0.2, and typical. nighttime visible light backgrounds would yield a count rate 0.6 electrons/pixel/sec. For spectroscopy, visible light rates will be far smaller. While it is clear that background visible light cannot produce a spurious event either, visible light photons from an object for which we are trying to measure UV flux could. Taking a conservative case of a 100:1 visible:UV photon ratio, a device framed at 100 Hz could measure a UV signal. with 30 events/sec without significant event overlap and nonlinearity (see next section). This would produce about 3000 visible photons/sec, or 30 events per frame. Since it can be expected that the distribution of the final event amplitudes will be fairly well defined, even these events could be discriminated. Even high ratios could be tolerated at faster frame rates and with some calibration.

To illustrate this, consider a typical. example. In NASA's JUNO mission, the UVS instrument will observe Jupiter from up close. The MCP detector in UVS will receive an average of 105 counts/sec from UV light distributed across an approx. 30 mm MCP plate detector face. Using a typical. ratio of 106 visible photons for each UV photon (more or less accurate for looking at the sunlit side of Jupiter), this would give about 1011 counts/sec from visible photons for a visible-sensitive detector across the same 30 mm diameter area. This translates into 10 counts/pixel for each image assuming a 1K×1K APS array with 10-micron pixels readout in one millisecond. This is an order lower than the required level for 100% visible rejection. This shows that visible light rejection and photon counting are readily feasible in the novel. and compact EBAPS structure.

Figure 15A:
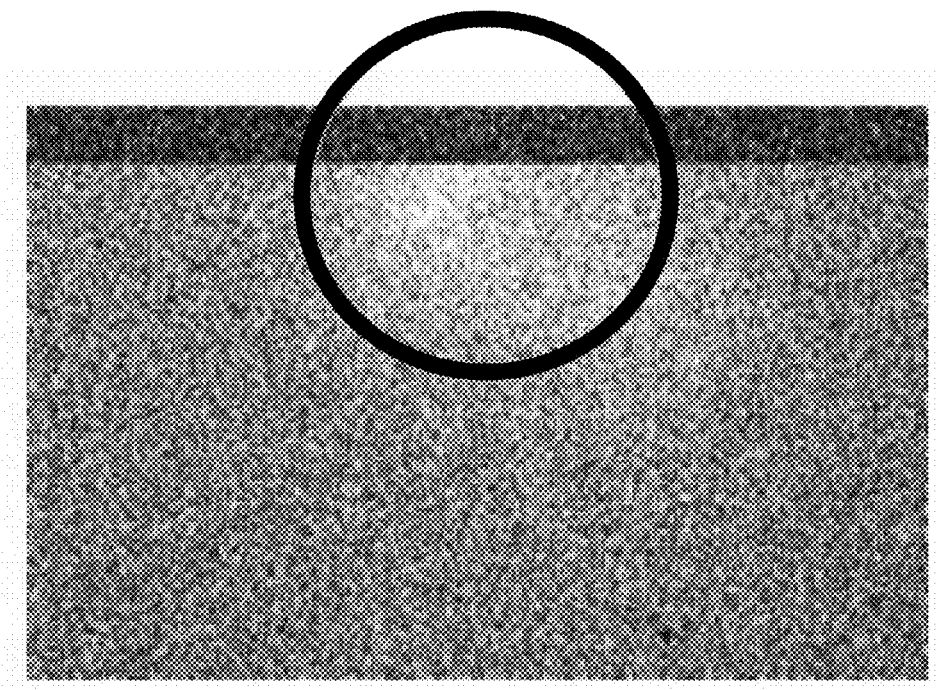
FIGS. 15a to 15d provide detector images and data graphs showing results from experiments done with an EBCCD incorporating a delta-doped CCD detector array in accordance with an embodiment of the invention.
Figure 15B:
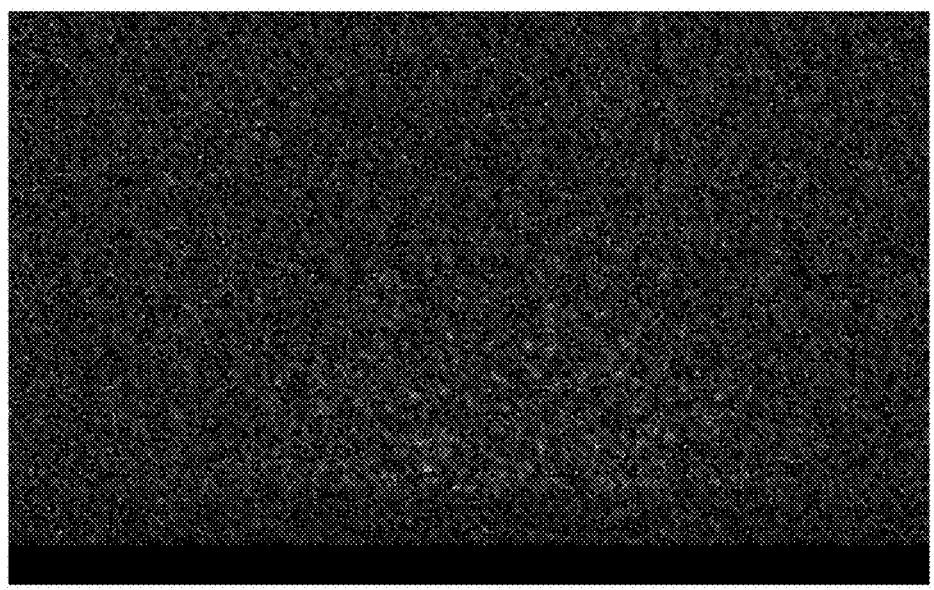
Figure 15C:
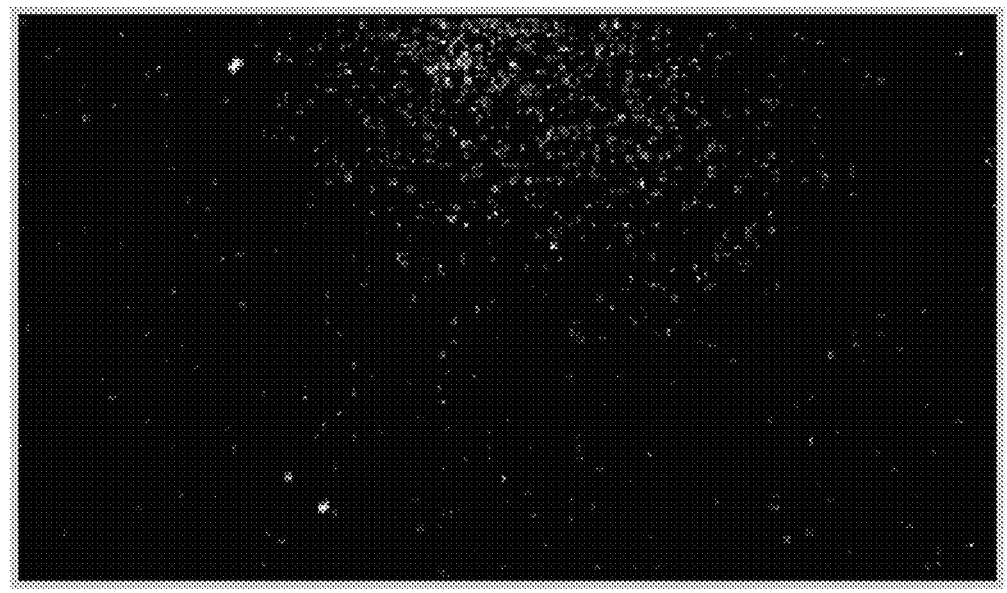
Figure 15D:
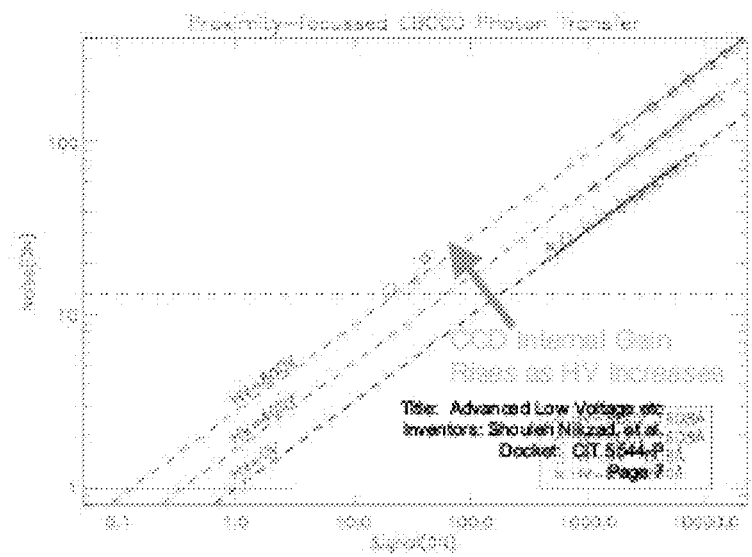

Preliminary data taken with a delta-doped CCD in accordance with this invention proves that this theoretical. is correct. As shown in FIGS. 15a to 15d, 100 field images were taken with a DDEBA detector in accordance with the current invention, and those results analyzed to determine if it was possible to distinguish noise from signal. using the device. The device was provided with a delta-doped CCD, but a standard photocathode, so actual. results with the device incorporating the improved DEPC photocathode are expected to improve. FIG. 15a shows an image of the results of 100 field images taken with the device (the circle in the image represents the photocathode outline. The photocathode portion is then extracted in FIG. 15b. Using filtering software it is possible to remove events above the set threshold of 60 to 100 eV (FIG. 15c) demonstrating an excellent ability to remove contributions from noise. In short, under all conditions the device shows lower escape threshold and good gain even at very low operating voltages, as shown in the plot provided in FIG. 15d.

Example 3

Exemplary Applications

Examples of science objectives and classes of missions requiring UV/VUV instruments are given below. Traditionally, MCPs have been used for these applications. While these work well, they have limits, and for decades scientists have attempted the development of newer technology solar-blind UV detectors that would operate without high voltage, have low noise background, large pixel. arrays with a uniform response across the array, and not be limited by count rates as MCP detectors are locally and globally. This is now possible through the current invention. DDEBAs will enable miniaturization, simplification, and low-power consumption while improving the performance of UV/VUV instruments.

Atmospheric Detection and Composition Studies

High efficiency and compact spectrometers and imagers can be mission enabling. VUV observations of the extended upper atmospheres of all of the planets and their satellites are needed, due to the small columns of gas involved and the strong interactions of UV photons over a few to a few tens of eV energy with simple atoms and molecules. Clarke and Paxton, 2002, have reviewed the basic principles of UV observations of solar system atmospheres. (See, "Ultraviolet Remote Sensing Techniques for Planetary Aeronomy", J. Clarke and L. Paxton, in 'Atmospheres n the Solar System Comparative Aeronomy', M. Mendillo, A. Nagy, and H. Waite, ed.'s, Geophysical. Monograph 130, AGU, p. 339, 2002, the disclosure of which is incorporated herein by reference.) Application of UV instrumentation to this problem requires a high degree of solar-blind response, due to the high number of visible photons for every UV photon in the solar spectrum.

Study of Aurorae

In planetary atmospheres, H Lyman-alpha (121.6 nm) and atomic oxygen emissions can help describe energy transfer processes in sky background, aurorae, planetary coronae, or thermosphere/exosphere density and temperature characteristics. The near-simultaneous viewing of a spatially resolved Jovian upper atmosphere in far ultraviolet (FUV), Lyman-alpha, extreme ultraviolet (EUV), and soft X-ray (XUV) wavelengths would enable the separation of energy contributions and help solve this mystery of energy transfer in outer planet atmospheres. Development of the proposed detector can also make possible spatially resolved H Lyman-alpha (121.6 nm) "maps" over short time scales providing important diagnostic information about the composition of many solar system objects including planets and comets. In planetary atmospheres, H Lyman-alpha emission can help describe energy transfer processes in aurorae, planetary coronae, or thermosphere/exosphere density and temperature characteristics. Comets often have an extended, variable H gas cloud that reveals a history of the comet's interaction with the solar environment. The interplanetary hydrogen density not only unveils the local stellar neighborhood in which our solar system resides but can assist us in forecasting the Sun's irradiance effects upon planetary atmospheres in the following month by helping us glimpse solar far-side chromospheric activity.

Mineralogy Analysis

Compact UV in situ instruments to perform mineralogy analysis and to study the soil. and rocks on Mars will also benefit from miniaturization and high performance enabled by the DDEBA by taking advantage of the high sensitivity, on chip processing (including correlation of spectra for in-situ mineral analysis), and low power enabled by this technology.

Observations of Planetary Upper Atmosphere

Mars may have lost an ocean's worth of water into space, and understanding the present physical. processes for loss of H and O atoms into space is necessary to establish the historical rates of escape for Mars. The altitude distributions of simple atomic and molecular species H, O, CO, $CO_2$, etc. can be determined by limb scans measuring scattered sunlight from these species across the disc of the planet and above the limb. These brightness distributions reveal the temperature and number density of species, including any superthernnal components, critical to understanding the present-day physics of the loss of water from the Martian atmosphere. The observations need to be performed at UV wavelengths where the highest sensitivity is obtained for small columns of atoms and molecules. High sensitivity UV detectors with good solar blind response such as the one propose here and low scattered light sensitivity will be required. Several. Mars missions in the near future (e.g., Mars Scout) may employ vacuum-UV detectors for this kind of measurement.

Example 4

Night-Vision

Figure 16A:
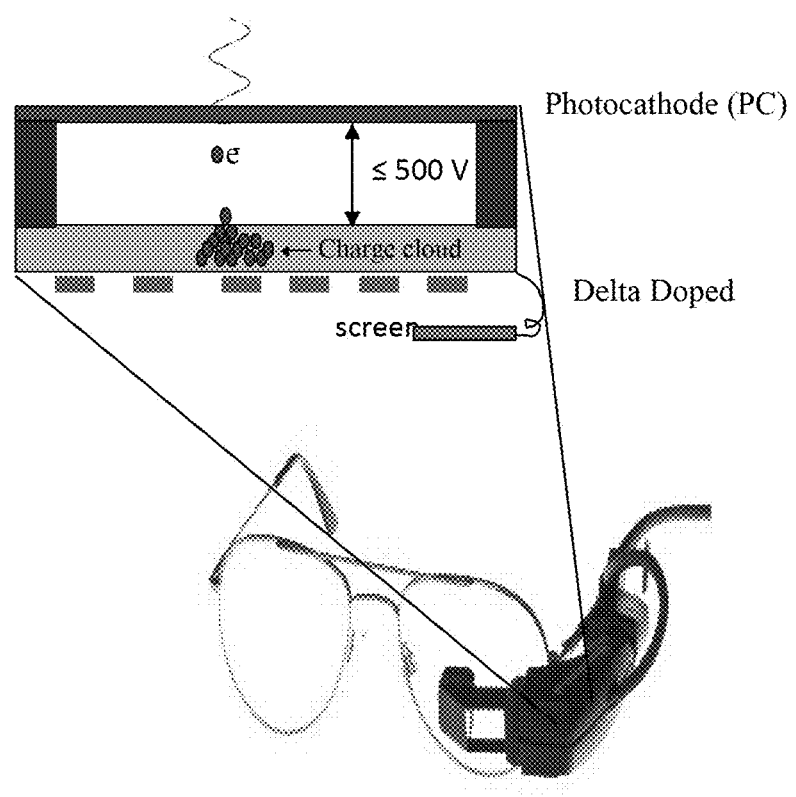
FIGS. 16a and 16b provide images and schematics for a wearable camera optic made in accordance with the current invention (16a), and a conventional. wearable camera optic (16b).
Figure 16B:
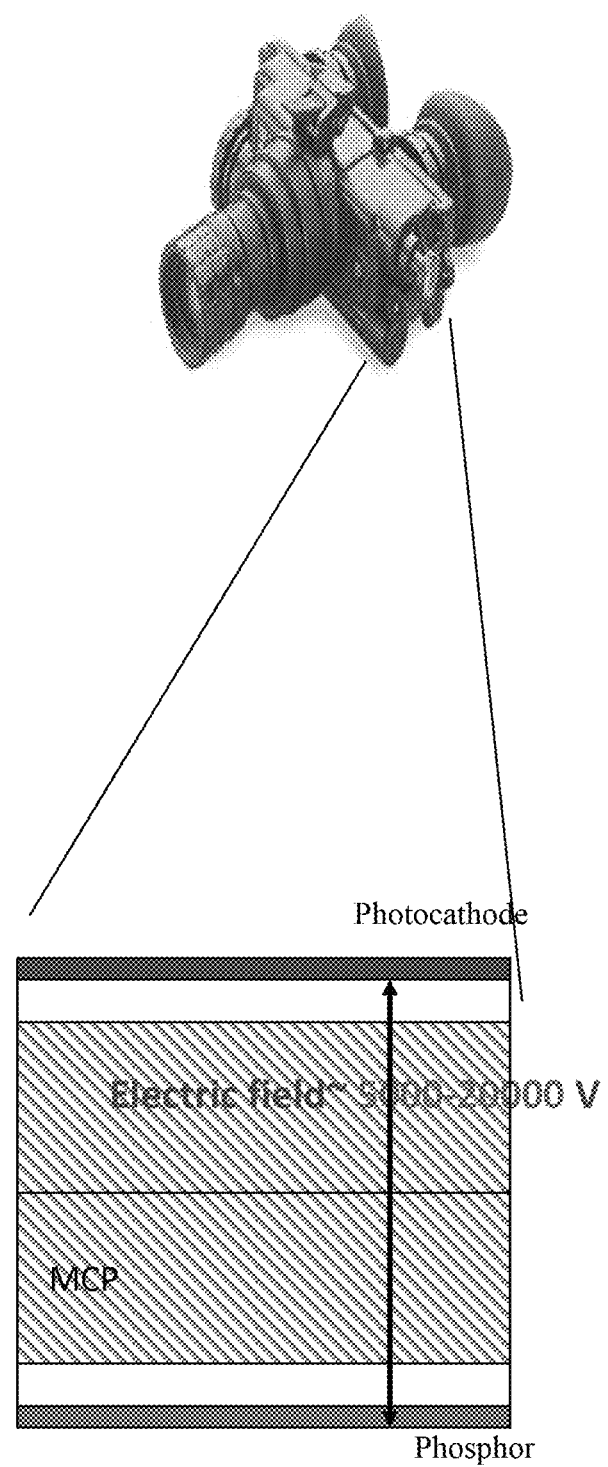

The combination of unique properties found in the DDEBA detector of the instant invention provides an ideal. platform for wearable night vision optics, such as that shown in FIG. 16a. In particular, the invention has the following advantages over the bulky conventional. wearable optics currently available (FIG. 16b):

Low-voltage operation ≤500 eV (replacing 5-20 KV applied voltage with much smaller, safer voltages);
Combined with wearable camera concept;
Low mass, high efficiency, high gain, and low noise;
Lower power requirements, better battery life, lower cost, lower voltage, more compact, easier electronics);
Simulated image, ergonomically much easier on personnel and battery logistics;
No microchannel plate (MCP) required; and
Easy fabrication, no sealed tube requirement.

OTHER REFERENCES

Other references that provide further background information on the technologies associated with the current invention may be found in the following references, the disclosures of each of which are incorporated herein by reference.

R. A. Beach and T. C. McGill, *J. Vac. Sci. Technol. B*, 17, 1753 (1999);
A. D. Bykhovski, et al., *Appl. Phys. Lett.*, 73 (24), 3577 (1998);
K. Gledhill, et al., *Proc. of SPIE*, 1656, (1992);
P. Jerram, et al., *Proc. Of SPIE*, 4306, (2001);
Z. M. Jiang, et al., *Chinese Phys. Lett.*, 14, 686 (1997);
Gregory T. A. Kovacs, et al., *Proc. of the IEEE*, 86, No. 8, (1998.);
Joseph T. Kung, et al., *Sensors and Actuators A*, 29, 209 (1991);
C. P. Parry, et al., *J. Appl. Phys.*, 71, 118 (1992);
D. H. Rich, et al., *Phys. Rev. B*, 39, 12758 (1989);
Eugene D. Savoye, et al., *Proc. of SPIE*, 501, 32 (1984);
A. L. Smith, et al., *Proc. of the MRS*, 448, 177-186 (1996);
S. M. Sze, Physics of Semiconductor Devices, 2nd Ed, Wiley & Sons, New York (1981) p. 42;
B. Wilson, in *Sensor Systems for Space Astrophysics in the 21st Century*. Pasadena, Calif.: JPL, 1991; and
Rusty Winzenread, *Proc. of SPIE*, 2198, 886 (1994).

SUMMARY

As described above, the DDEBA detector/imager of the current invention provides for a low cost, low power, robust sensor array with excellent quantum efficiency. In addition, the detector array is radiation tolerant, compact, and possesses good resolution and large format. Table 1, below, summarizes the advantages of the proposed technology compared with the state of the art imaging technology of the current invention.

TABLE 1

Advantages of Propose Technology

| | \multicolumn{6}{c}{Solar-blind UV Detector} | | | | | |
|---|---|---|---|---|---|---|
| | Low Power | Low Voltage | Photon Counting | High QE | Compact | Robust |
| MCP | | | x | | | |
| Conventional EBCCD | | | x | x | | |
| Monolithic GaN arrays | x | x | | | X | x |
| DDEBA imagers | x | x | x | x | X | x |

The major features of the detector include:

- High-efficiency, high-resolution, high-gain, photon counting, low power, and low-noise: resulting from novel structure and combination of delta doping, a novel photocathode, and advanced silicon CMOS APS technologies.
- Low-voltage operation: Delta-doping technology enables low-energy electron detection in silicon arrays over an order of magnitude below the currently available energy threshold, correspondingly reducing the accelerating voltage from 10-15 kV to 0.3-1 kV, significantly simplifying the instrument and system design.
- Low mass, magnet-free operation: Special. proximity focusing, enabled by the reduction in detectable electron energy, allows the elimination of a large and bulky permanent magnet (and elimination of disturbance torques on spacecraft attitude in low orbit) and construction of a compact, versatile detector.
- Increased maximum count rate, random access readout: Sparse and fast readout of a low noise CMOS APS technology will increase the maximum count rate per pixel. by allowing fast frame rates.
- Robustness and Reduction in complexity in fabrication, handling, and operation: The proposed DDEBA will be far less costly and time-consuming to fabricate compared to state of the art MCPs and conventional. EBCCDs. The stable photocathode and simple architecture reduce the complexity. Stability of AlGaN photocathodes (no need for integration into sealed tube under vacuum), stability of the delta doped back-illuminated imager (long life time, no damage due to high energy electrons, stable response), and lower voltage requirements (less prone to arcing compared to MCPs), and elimination of magnets greatly enhance robustness. The detector is versatile, and could easily be accommodated in most instruments.
- Radiation tolerance: The device will also be more impervious to environmental radiation damage than conventional. EBCCDs, due to robustness of the novel. photocathode (e.g., AlGaN material has wide bandgap material., intrinsically radiation tolerant), and use of CMOS APS arrays (which do not require multiple charge transfer operations like CCDs), measured up to 10 krad). (See, e.g., B. R. Hancock, et al., Proc. of SPIE, 4306, 147 (2001), the disclosure of which is incorporated herein by reference.) Furthermore, radiation hard CMOS is also under development that DDEBA can easily utilize.

In summary, the detector of the current invention will have high sensitivity, high dynamic range while being easy to fabricate, robust for space missions, as well as compact and low power to comply with the stringent mass and power requirements of new applications, such as, for example, night-vision optics and space-based detectors.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A photodetector comprising:
    a photocathode formed of a non-cesiated, semiconductor material, said photocathode having an activation layer that has one of either a piezoelectrically induced polarization field or a delta-doped surface, such that where at least one photon within a selected wavelength range impinges on said photocathode at least one electron is emitted from the surface of said photocathode;
    a thinned delta-doped imager array, said imager array being disposed across an accelerating gap from said photocathode;
    an electric field generator for generating an electric field across said accelerating gap, said electrical field generator being disposed in relation to said imager array and said photocathode such that the electric field accelerates said at least one electron across said accelerating gap to impinge on said imager array; and
    wherein the accelerating gap is sufficiently small such that the electrons produced from said photocathode are proximity focused onto said imager array such that a plurality of electrons are generated from each of the accelerated electrons that impinge thereon, and wherein only a single electron is generated for photons that impinge directly thereon.

2. The photodetector of claim 1, further comprising detector circuitry in signal communication with said imager array for monitoring said signal and applying a threshold detection level to said signal to filter noise from said signal.

3. The photodetector of claim 1, wherein the distance of the accelerating gap between the photocathode and the imager array is less than 1000 microns.

4. The photodetector of claim 1, wherein the potential of the electric field is less than 1 kV.

5. The photodetector of claim 1, wherein the imager array includes a thin layer of a single-crystal semiconductor deposited on the backside thereof, said thin layer incorporating a sheet of doping material.

6. The photodetector of claim 5, wherein the doping material is a single monolayer of about $2 \times 10^{14}$ boron atoms/cm$^2$ disposed about 1 nm from the backside surface of said imager.

7. The photodetector of claim 1, wherein the imager array is a CCD imager.

8. The photodetector of claim 1, wherein the imager array is a CMOS imaging array.

9. The photodetector of claim 8, further comprising signal processing electronics in signal communication with said imager array for providing random access readout of said imager array.

10. The photodetector of claim 8, wherein the power required to operate the detector is less than about 1 watt.

11. The photodetector of claim 8, further comprising signal processing electronics in signal communication for integrating the signal from said imager array with a signal spectrum from another spectrometer.

12. The photodetector of claim 1, wherein the specified wavelength falls within one of the spectral ranges selected from the group consisting of infrared, visible or ultraviolet.

13. The photodetector of claim 1, wherein the imager array is capable of detecting electrons having energies of at least as low as 100 eV.

14. The photodetector of claim 1, wherein the semiconductor material is a III-N semiconductor.

15. The photodetector of claim 14, wherein the semiconductor material is one of either a GaN or AlGaN film disposed on a sapphire or GaN substrate.

16. The photodetector of claim 15, wherein the semiconductor material is delta-doped.

17. The photodetector of claim 1, wherein the imager array exhibits no degradation in efficiency at a radiation exposure of up to 10 krad.

18. The photodetector of claim 1, wherein the detector is configured for use in an application selected from the group consisting of atmospheric analysis, aurorae study, mineralogical analysis and low-light vision.

19. A photodetector comprising:
a photocathode formed of a non-cesiated, semiconductor material, said photocathode having an activation layer that has one of either a piezoelectrically induced polarization field or a delta-doped surface, such that where at least one photon within a selected wavelength range impinges on said photocathode at least one electron is emitted from the surface of said photocathode;
a thinned delta-doped imager array, said imager array being disposed across an accelerating gap from said photocathode;
an electric field generator for generating an electric field across said accelerating gap, said electrical field generator being disposed in relation to said imager array and said photocathode such that the electric field accelerates said at least one electron across said accelerating gap to impinge on said imager array;
wherein the accelerating gap is sufficiently small such that the electrons produced from said photocathode are proximity focused onto said imager array such that a plurality of electrons are generated from each of the accelerated electrons that impinge thereon, and wherein only a single electron is generated for photons that impinge directly thereon; and
detector circuitry in signal communication with said imager array for monitoring said signal and applying a threshold detection level to said signal to filter noise from said signal.

20. A method of forming a photodetector comprising:
providing at least one spacer having first and second ends;
disposing at one end of said spacer a photocathode formed of a non-cesiated, semiconductor material having an activation layer that has one of either a piezoelectrically induced polarization field or a delta-doped surface, wherein said activation layer enables at least one photon within a wavelength range that impinges on said photocathode to cause emission of at least one electron from the surface of said photocathode;
disposing at the other end of said spacer a thinned delta-doped imager array; and
wherein the space between said photocathode and said imager array defines an accelerating gap, wherein the accelerating gap is sufficiently small such that the electrons from said photocathode are proximity focused onto said imager array;
disposing an electric field generator into electrical communication with said accelerating gap, such that said electric field generator generates an electric field across said accelerating gap, said electric field being designed to accelerate said at least one electron from said photocathode across said accelerating gap; and
wherein the imager array creates a signal by producing a plurality of electrons from each of the accelerated electrons that impinges thereon, while generating only a single electron for photons that impinge directly thereon.

21. The method of claim 20, further comprising connecting detector circuitry in signal communication with said imager array for monitoring said signal and applying a threshold detection level to said signal to filter noise from said signal.

22. The method of claim 20, wherein the distance of the accelerating gap between the photocathode and the imager array is less than 1000 microns.

23. The method of claim 20, wherein the potential of the electric field is less than 1 kV.

24. The method of claim 20, wherein the imager array includes a thin layer of a single-crystal semiconductor deposited on the backside thereof, said thin layer incorporating a sheet of doping material.

25. The method of claim 24, wherein the doping material is a single monolayer of about $2\times10^{14}$ boron atoms/cm$^2$ disposed about 1 nm from the backside surface of said imager.

26. The method of claim 20, wherein the imager array is a CCD imager.

27. The method of claim 20, wherein the imager array is a CMOS imaging array.

28. The method of claim 27, further comprising connecting signal processing electronics in signal communication with said imager array for providing random access readout of said imager array.

29. The method of claim 27, wherein the power required to operate the detector is less than about 1 watt.

30. The method of claim 27, further comprising connecting signal processing electronics in signal communication with said imager for integrating the signal from said imager array with a signal spectrum from another spectrometer.

31. The method of claim 20, wherein the specified wavelength falls within one of the spectral arrays selected from the group consisting of infrared, visible or ultraviolet.

32. The method of claim 20, wherein the imager array is capable of detecting electrons having energies of at least as low as 100 eV.

33. The method of claim 20, wherein the semiconductor material is a III-N semiconductor.

34. The method of claim 33, wherein the semiconductor material is one of either a GaN or AlGaN film disposed on a sapphire or GaN substrate.

35. The method of claim 33, wherein the semiconductor material is delta-doped.

36. The method of claim 20, wherein the imager array exhibits no degradation in efficiency at a radiation exposure of up to 10 krad.

* * * * *